United States Patent
Ogura

(10) Patent No.: US 7,212,476 B2
(45) Date of Patent: May 1, 2007

(54) OPTICAL DISC REPRODUCING DEVICE SELECTIVELY USING A CHANNEL BIT FREQUENCY OR A FREQUENCY THAT IS HALF OF THE CHANNEL BIT FREQUENCY

(75) Inventor: Youichi Ogura, Saijo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 591 days.

(21) Appl. No.: 10/275,536

(22) PCT Filed: Mar. 8, 2002

(86) PCT No.: PCT/JP02/02177

§ 371 (c)(1),
(2), (4) Date: Nov. 7, 2002

(87) PCT Pub. No.: WO02/073615

PCT Pub. Date: Sep. 19, 2002

(65) Prior Publication Data

US 2003/0137912 A1 Jul. 24, 2003

(30) Foreign Application Priority Data

Mar. 9, 2001 (JP) .............................. 2001-067517

(51) Int. Cl.
*G11B 20/10* (2006.01)

(52) U.S. Cl. ................ 369/47.24; 369/47.3; 369/59.13
(58) Field of Classification Search ...................... None
See application file for complete search history.

(56) References Cited

U.S. PATENT DOCUMENTS

| 5,388,087 A | | 2/1995 | Saiki et al. | |
|---|---|---|---|---|
| 5,559,774 A | * | 9/1996 | Watanabe et al. | ........ 369/47.24 |
| 5,612,933 A | | 3/1997 | Iso et al. | |
| 5,729,517 A | * | 3/1998 | Fujiwara et al. | ......... 369/59.22 |

(Continued)

FOREIGN PATENT DOCUMENTS

EP 0 878 797 5/1998

(Continued)

OTHER PUBLICATIONS

U.S. Appl. No. 09/857,162 entitled Digital Reproduction Signal Processor.

*Primary Examiner*—William Korzuch
*Assistant Examiner*—Christopher Lamb
(74) *Attorney, Agent, or Firm*—Wenderoth, Lind & Ponack, L.L.P.

(57) ABSTRACT

A data demodulation process rate is varied according to a reproduction state, thereby reducing power consumption while maintaining a reading performance in a favorable state. A channel rate process data demodulation device performs a data demodulation process by employing channel bit frequency. Further, a half rate process data demodulation device performs a data demodulation process by employing frequency half as high as the channel bit frequency. These devices demodulate digital data from an optical recording medium. A process rate switching device switches a process rate at data demodulation, whereby demodulation is performed by switching between the data demodulation devices according to a quality of a reproduction signal, so as to reproduce the digital data recorded on the optical recording medium.

4 Claims, 25 Drawing Sheets

U.S. PATENT DOCUMENTS

| | | | |
|---|---|---|---|
| 6,046,874 A * | 4/2000 | Takahashi | 360/65 |
| 6,069,856 A | 5/2000 | Mita et al. | |
| 6,215,744 B1 * | 4/2001 | Mita et al. | 369/47.24 |
| 6,215,751 B1 * | 4/2001 | Tsuchinaga | 369/47.35 |
| 6,366,631 B1 | 4/2002 | Nakayama et al. | |
| 6,381,203 B1 | 4/2002 | Muramatsu | |
| 6,807,134 B2 | 10/2004 | Nakajima et al. | |
| 6,834,035 B1 * | 12/2004 | Marukawa et al. | 369/59.22 |

FOREIGN PATENT DOCUMENTS

| | | |
|---|---|---|
| EP | 0 881 639 | 5/1998 |
| JP | 4-45315 | 4/1992 |
| JP | 4-245711 | 9/1992 |
| JP | 7-262703 | 10/1995 |
| JP | 8-7498 | 1/1996 |
| JP | 10-283729 | 10/1998 |
| JP | 10-312640 | 11/1998 |
| JP | 10-326457 | 12/1998 |
| JP | 11-345460 | 12/1999 |
| JP | 2001-101799 | 4/2001 |
| WO | 01/26111 | 4/2001 |

\* cited by examiner output waveform from waveform equalization means 2 sampling signal at binarization judgement

PR(a,b,b,a) equalization output signal state transition diagram trellis diagram and remaining path sampling frequency in process employing channel bit frequency sampling frequency when process rate is switched between inner and outer circumferences construction of amplitude detection means reproduction signal envelope signal defect information recording code
(NRZI) 1 1 1 1 0 0 0 0 0 1 1 1 0 0 0 1 1 1 1 1 1 1 1 1 0 0 0 0 0

(a) emphasis on high frequency component

Fig.28 (c)

sampling suited for PRML

Fig.28 (d)

(c) digital equalization into multiple values

OPTICAL DISC REPRODUCING DEVICE SELECTIVELY USING A CHANNEL BIT FREQUENCY OR A FREQUENCY THAT IS HALF OF THE CHANNEL BIT FREQUENCY

TECHNICAL FIELD

The present invention relates to an optical disk reproducing device for reproducing digital data recorded on an optical disk medium and, more particularly, to an improved optical disk reproducing device adopting a digital data demodulation means which employs a PRML (Partial Response Maximum Likelihood) signal process system that is effective in high-density recording/reproduction in the linear direction. The improved optical disk reproducing device is able to reduce power consumption for high multiple speed reproduction, and maintain a quality of digital demodulation data and a reading performance in reproduction at an unfavorable tilt and signal-noise ratio under adverse conditions that a defect or the like is frequently generated.

BACKGROUND ART

As a method for recording digital data in an optical disk medium, there is often employed a method in which the linear velocity is kept constant so that a recording density on the recording medium is made uniform, as adopted for a compact disk (hereinafter, abbreviated as a "CD") or a DVD (Digital Versatile Disk). When digital data is reproduced with respect to an optical disk reproduction signal which is subjected to mark width modulation, and digitally modulated and recorded so that a linear recording density is constant, a phase of a clock component corresponding to a channel bit frequency of the reproduction signal is detected, to construct a phase locked loop, thereby performing phase synchronous pull-in.

At this time, when the frequency of the clock component of the reproduction signal is vastly different from a frequency of a clock which is generated by the phase locked loop, it is highly likely that the phase synchronous pull-in is not completed or at pseudo pull-in to a frequency that is different from a frequency to be pulled in is performed. To avoid these problems, a reproduction linear velocity cycle is detected from a specific pulse length or pulse interval included in the reproduction signal, and a disk rotational speed or free-running frequency of the phase locked loop is controlled on the basis of the detected reproduction linear velocity cycle, whereby normal phase synchronous pull-in can be performed.

Conventionally, for example, there is a disk reproduction system as shown in FIG. 27, that enables normal phase synchronous pull-in. In this conventional optical disk reproducing device, digital recording codes as shown in FIG. 28(a) are recorded on an optical recording medium 50 such as an optical disk so as to have a constant linear recording density. It is assumed, for example, that recorded data is data in which the number of continuous pieces of data "0" or data "1" is restricted to be 3 to 14 as in an 8–16 modulation system. As shown in FIG. 28(a), a signal obtained by reproduction by means of a reproduction means 51, such as an optical pickup, has an amplitude attenuated due to greater interference for a higher frequency component, with an increase in a recording density of the recorded data in the linear direction. Therefore, this signal is amplified by a not-shown preamplifier and, thereafter, corrected so that a high frequency component is emphasized, by a waveform equalization means 2.

The high-frequency-emphasized reproduction signal as shown in FIG. 28(b) is sampled into a multi-bit digital signal by an analog/digital converter 3, which is a means for converting an analog signal into a digital signal by employing a reproduction clock generated by a VCO (Voltage Controlled Oscillator) 62. At this time, when a phase of the reproduction clock is synchronized with a phase of a clock component of the reproduction signal, sampled data as shown in FIG. 28(c) is obtained. FIG. 28(c) shows sampled data which is suited particularly for a Partial Response Maximum Likelihood (hereinafter, abbreviated as a "PRML") signal process system.

The PRML signal process system is one which applies a partial response system in a reproduction system in which an amplitude of a high frequency component is deteriorated with an increase in a recording density in the linear recording direction, and thus a signal-noise ratio is increased, and intentionally adds waveform interference to the reproduction system, so as to realize a reproduction system which requires no high frequency component, as well as increases the quality of reproduction data by a maximum likelihood decoding method for estimating the most likely series by probability calculation in consideration of the waveform interference. The increase in the recording density in the linear recording direction is adopted as one of the methods for increasing the recording density when, for example, a recording capacity is increased from a CD to a DVD.

This sampled multi-bit digital signal is inputted to an offset correction means 52, thereby correcting an offset component included in a reproduction digital signal. The reproduction digital signal which is offset-collected by the offset correction means 52 is subjected to partial response equalization by a transversal filter 53. At this time, by applying partial response equalization, a multi-valued equalized output signal is obtained as shown in FIG. 28(d). A weight coefficient of a tap of the transversal filter 53 is supplied from a tap weight coefficient setting means 54 by employing an LMS (Least Mean Square; hereinafter, abbreviated as "LMS") algorithm for minimizing a square mean value of an equalization error. An output signal from the transversal filter 53 is demodulated into binarized digital data by a viterbi decoder 55 as a kind of a maximum likelihood decoder.

A phase synchronous reproduction clock when sampling is performed by the analog/digital converter 3 is controlled as follows.

Initially, a position of crossing the zero level is continuously detected from an output signal from the offset correction means 52, a synchronous pattern length in a specific period of one or more frames is detected by employing output from a zero-crossing length detector 56 which counts the number of sampling between neighboring zero-crossing positions, and a frequency error amount for controlling frequency of the reproduction clock is decided by a frequency error detector 57 which detects a cycle of detecting a synchronous pattern.

Phase information of reproduction digital data is detected by a phase comparator 58 by employing the output signal from the offset correction means 52, and a phase error amount for controlling phase synchronization between the reproduction clock and the reproduction digital data is decided. An output signal from a frequency control loop filter 59 is converted into an analog signal by a digital/analog converter 61b, so that the frequency is controlled by employing the frequency error amount outputted from the frequency error detector 57 until an area where the reproduction clock can be synchronized with the reproduction digital signal is reached, and a VCO 62 is controller by the output signal from the digital/analog converter 61*b*. On the other hand, an output signal from a phase control loop filter 60 is converted into an analog signal by a digital/analog converter 61*a*, so that the reproduction clock is synchronized with the reproduction digital signal by employing the phase error amount outputted from the phase comparator 58, and the VCO 62 is controlled by the output signal from the digital/analog converter 61*a*. Actually, in this prior art example in FIG. 27, the output signal from the digital/analog converter 61*b* and that from the digital/analog converter 61*a* are added together by an adder 63, an the VCO 62 is controlled by a sum signal.

By a series of these operations, the phase of the reproduction clock and the phase of a clock component of the reproduction digital data can be synchronized with each other and, accordingly, the PRML signal process system becomes applicable, whereby digital data recorded on an optical disk medium can be reproduced stably and accurately.

The conventional optical disk reproducing device, which is constructed as described above, performs demodulation of digital data by a digital signal process in which sampling is performed by an AD converter by employing a clock which is synchronized with a channel bit frequency as a clock component of a reproduction waveform from the optical disk, and the PRML process is performed.

At this time, a PLL circuit, an FIR filter, and a viterbi decoder as constituent elements are processed at a channel bit rate.

However, when digital data demodulation which applies the PRML signal process is performed by employing the reproduction clock which is synchronized with the channel bit frequency of the digital data recorded on the recording medium, the frequency of the reproduction clock is increased at high multiple speed reproduction, that is, at reproduction at a rate higher than a standard reproduction speed for an optical disk, and thus power consumption at a digital circuit is increased dependently on that frequency. Further, the highest reproduction multiple speed is restricted by a bit width in digital operation.

Then, it has been already attempted to perform data demodulation by employing a reproduction clock which is synchronized with a frequency half as high as the channel bit frequency, thereby reducing power consumption at high multiple speed reproduction.

However, in this method, an amount of information relating to a time component after sampling is deteriorated dependently on a reproduction clock of the half frequency, resulting in performance deterioration in the phase locked loop or the transversal filter as described above. Therefore, when there exists local deterioration in reproduction characteristics which depends on a defect generated when the reproduction signal is disturbed due to quality deterioration in the reproduction signal, which depends on the magnitude of a tilt angle that is defined as an angle between an axis perpendicular to the recording surface of the optical disk and an axis of an approaching laser beam which is applied from the reproduction means 51 to the recording surface, or flaws, dirt, fingerprints or the like on the disk surface, it is impossible to maintain the quality of the digital demodulation data and the reading performance in a favorable state. Thus, the above-described method cannot be an effective solution to realize both reduced power consumption and increased reading performance.

The present invention is made to solve the above-described problems and has for its object to provide an optical disk reproducing device which is able to reduce power consumption while maintaining the quality of digital demodulation data and reading performance in a favorable state, even when a signal-noise ratio is deteriorated and a quality of a reproduction signal is locally deteriorated as well dependently on a tilt or a defect.

SUMMARY OF THE INVENTION

To solve the above-mentioned problems, an optical disk reproducing device according to the present invention comprises a channel rate process data demodulation part for performing a data demodulation process by mainly employing a channel bit frequency, as well as a half rate process data demodulation part for performing a data demodulation process by employing a frequency half as high as the channel bit frequency, which are data demodulation parts for demodulating digital data from an optical recording medium on which the data is digitally recorded in a form of recording codes having a restriction that at least three of the same code continue, and a process rate switching part for switching a process rate at data demodulation. This optical disk reproducing device switches between the channel rate process data demodulation part and the half rate process data demodulation part by the process rate switching part according to a data demodulation state, thereby performing digital data demodulation.

The present invention solves the above-described problems with the above-described function. That is, the quality of the demodulation data is increased by applying a PRML signal process system which is supposed to be advantageous in high-density recording/reproduction, and reduced power consumption is achieved by varying a data demodulation process rate. Further, the quality of the digital demodulation data and reading performance can be maintained in a favorable state even when a signal-noise ratio is deteriorated and reproduction characteristics are locally deteriorated as well dependently on a tilt or defect.

That is, according to a first aspect of the present invention, there is provided an optical disk reproducing device comprising: a channel rate process data demodulation part for performing a process of demodulating digital data from an optical recording medium on which the data is digitally recorded in a form of recording codes having a restriction that at least three of the same code continue, by mainly employing a channel bit frequency; a half rate process data demodulation part for performing process of demodulating the digital data from the optical recording medium by employing a frequency half as high as the channel bit frequency; and a process rate switching part for switching a data demodulation part for performing digital data demodulation between the channel rate process data demodulation part and the half rate process data demodulation part, thereby switching a process rate at data demodulation. Therefore, a data demodulation process can be performed at a frequency half as high as the channel bit frequency with respect to high multiple speed reproduction which unfavorably increases power consumption, whereby the power consumption can be reduced almost by half.

According to a second aspect of the present invention, in the optical disk reproducing device as defined in the first aspect, the process rate switching part generates a process rate switching signal so that: the half rate process data demodulation part is selected in the case of a favorable data demodulation state; and the channel rate process data demodulation part is selected in the case of a deteriorated data demodulation state. Therefore, a rate for data demodulation process can be varied according to a reproduction state. Accordingly, the data demodulation is performed by employing a frequency half as high as the channel bit frequency in a normal state, thereby giving priority over reduction of power consumption, while the data demodulation is performed by employing the channel bit frequency in a state where the data demodulation is difficult, thereby giving priority over the quality of the demodulation data.

According to a third aspect of the present invention, the optical disk reproducing device as defined in the first aspect, further comprises: a preamplifier for emphasizing an output amplitude of an optical reproduction signal which is reproduced from the optical recording medium; a waveform equalization part for equalizing a waveform of the signal whose output amplitude is emphasized by the preamplifier, to emphasize a prescribed frequency band; an analog/digital converter for sampling the signal whose waveform is equalized by the waveform equalization part by a reproduction clock to obtain multi-bit digital data; a channel rate process phase locked loop part for controlling an oscillation frequency of the reproduction clock so that it is synchronized with a phase of a clock component of a sampling signal which is the multi-bit digital data outputted from the analog/digital converter; a half rate process phase locked loop part for controlling the oscillation frequency of the reproduction clock so that it is synchronized with a phase of a clock which is half the clock component of the sampling signal outputted from the analog/digital converter; a process rate variable type transversal filter for performing partial response equalization of the sampling signal outputted from the analog/digital converter; and a half rate process maximum likelihood decoder for performing data demodulation with respect to an equalization output signal as output from the process rate variable type transversal filter, according to the type of an applied partial response, in which optical disk reproducing device switching is performed between the channel rate process phase locked loop and the half rate process phase locked loop according to a process rate switching signal generated from the process rate switching part, as well as a process rate of the process rate variable type transversal filter is switched. Therefore, a maximum likelihood decoder or the like which theoretically causes no deterioration in the demodulation performance can perform the process by employing the frequency half as high as the channel bit frequency at all times, thereby requiring no additional provision for a process employing the channel bit frequency, resulting in suppression of an increase in the circuit scale. Moreover, when the data demodulation process is performed by employing the channel bit frequency, reduced power consumption is achieved as compared with cases of processing at the same frequency.

According to a fourth aspect of the present invention, in the optical disk reproducing device as defined in any of the first to third aspects, the process rate switching part generates the process rate switching signal according to whether a reproduction position on the optical recording medium is located in an inner circumference or an outer circumference. Therefore, when channel bit frequency at data demodulation differs according to a position in the inner or outer circumference of the disk recording medium, a data process rate according to each position can be selected, whereby a difference in power consumption caused by a reproduction position can be suppressed.

According to a fifth aspect of the present invention, in the optical disk reproducing device as defined in the fourth aspect, the process rate switching part judges the reproduction position in the inner or outer circumference of the optical recording medium on the basis of address information recorded on the optical recording medium, and generates the process rate switching signal according to the judged position. Therefore, when the channel bit frequency at data demodulation differs according to a position in the inner or outer circumference of the disk recording medium, a reproduction position can be accurately grasped and power consumption is accurately controlled.

According to a sixth aspect of the present invention, in the optical disk reproducing device as defined in the fourth aspect, the process rate switching part generates the process rate switching signal so that, when data demodulation is performed with rotation of the optical recording medium kept constant; the channel rate process data demodulation part as described in the first aspect is selected for the inner circumference side where the channel frequency is low; and the half rate process data demodulation part described in the first aspect is selected for the outer circumference where the channel frequency is high. Therefore, reduced power consumption can be achieved. Moreover, even when the demodulation is performed on the outer circumference side where the channel bit frequency is higher, an oscillator having the same oscillation range as on the inner circumference side may be employed, thereby reducing a burden of designing an oscillator.

According to a seventh aspect of the present invention, in the optical disk reproducing device as defined in any of the first to third aspects, the process rate switching part has a defect detection part for detecting a defect which occurs due to a deficiency on the optical recording medium, and generates the process rate switching signal so that the channel rate process data demodulation part described in the first aspect is selected when the defect detection part decides that there is a defect; and that the half rate process data demodulation part described in the first aspect is selected when the defect detection part decides that there is no defect. Therefore, even when there exists a defect which makes it difficult to perform data demodulation, phase synchronization between demodulation data and a reproduction clock can be maintained in a favorable state or restored, thereby maintaining a reading performance favorably.

According to an eighth aspect of the present invention, in the optical disk reproducing device as defined in the seventh aspect, the process rate switching part: has an amplitude detection part for detecting amplitude information of a reproduction waveform by smoothing, as a judgement part for judging the presence or absence of the defect, and judges that there is no defect when an amplitude value detected by the amplitude detection part is equal to or higher than a prescribed level, while judging that there is a defect when the amplitude value is equal to or lower than the prescribed level, thereby generating the process rate switching signal. Therefore, defect information can be accurately detected and, thus, switching to a data demodulation process employing the channel bit frequency is not performed more than required, resulting in reduced power consumption and a stable system.

According to a ninth aspect of the present invention, in the optical disk reproducing device as defined in the eighth aspect, the process rate switching part has a defect state judgement part for judging a defect state pattern on the basis of the amplitude information detected by the amplitude detection part, and generates the process rate switching signal according to the kind of defect information obtained by the defect state judgement part. Therefore, the data demodulation process rate can be controlled with respect to the scale as well as the kind of the defect, and thus a data demodulation process employing the channel bit frequency can be performed only in case of need, whereby, as compared with the invention as described in the eighth aspect, power consumption is further reduced, and a more stable system is realized.

According to a tenth aspect of the present invention, in the optical disk reproducing device as defined in the eighth aspect, the process rate switching part has: a defect state judgement part for judging a defect state pattern from the amplitude information detected by the amplitude detection part; and a defect stage distinguishing part for distinguishing a defect degree which is estimated from a combination of the defect state patterns judged by the defect state judgement part, into plural stages, and generates the process rate switching signal so that the channel rate process data demodulation part described in the first aspect is selected for a defect of a stage where the data demodulation is thought to be difficult; and that the half rate process data demodulation part described in the first aspect is selected for other cases where there is no defect or it is judged that there is a small degree of defect. Therefore, the data demodulation process rate can be optimized also with respect to a defect that is formed by composition of various elements, whereby, as compared with the invention as described in the ninth aspect, the power consumption is further reduced, and a more stable system is realized.

According to an eleventh aspect of the present invention, in the optical disk reproducing device as defined in the eighth aspect, the process rate switching part has: a defect position storage part for storing information of a position where the amplitude detection part judges that there is a defect, and, when the data demodulation is performed again for a part where reproduction has been performed once, refers to the defect information stored in the defect position storage part, and generates the process rate switching signal so that the channel rate process data demodulation part described in the first aspect is selected in advance for a part where there is a defect. Therefore, the data demodulation process rate can be previously switched for a part where a defect exists, whereby the accuracy of data demodulation at second or subsequent times is increased and, thus, the reading performance is stabilized.

According to the twelfth aspect of the present invention, in the optical disk reproducing device as defined in the eight aspect, when digital data is demodulated from an optical recording medium on which the digital data are recorded spirally, the process rate switching part generates the process rate switching signal so that the channel rate process data demodulation part described in the first aspect is selected for a position where the amplitude detection part judges that there is a defect, and a predetermined range from that position; and the half rate process data demodulation part described in the first aspect is selected for other areas. Therefore, since it is highly likely that defects which are generated by flaws, fingerprints or the like exist on the periphery of a position where a defect is detected in an optical disk or the like on which data is spirally recorded, the data demodulation process is previously switched to employ the channel bit frequency for a part on the periphery of the position where the defect is detected, whereby reproduction which gives priority over the quality of demodulation data can be performed.

According to a thirteenth aspect of the present invention, in the optical disk reproducing device as defined in the twelfth aspect, the process rate switching part generates the process rate switching signal so that the channel rate process data demodulation part is selected when digital data that exists at the position where the amplitude detection part judges that there is a defect, and on one track where there is the defect, is reproduced; and the half rate process data demodulation part is selected when digital data that exists in other areas is reproduced. Therefore, since it is highly likely that defects which are generated by flaws, fingerprints or the like exist on the periphery of a position where a defect is detected in an optical disk or the like on which data is spirally recorded, a data demodulation process is previously switched to employ the channel bit frequency for a part on the periphery of the position where the defect is detected, whereby reproduction which gives priority over the quality of demodulation data can be performed.

According to a fourteenth aspect of the present invention, in the optical disk reproducing device as defined in the eighth aspect, the process rate switching part generates the process rate switching signal so that the half rate process data demodulation part described the first aspect is selected in a normal reproduction state; the half rate process data demodulation part is switched to the channel rate process data demodulation part described the first aspect when the amplitude detection part judges that there is a defect; and thereafter the selection of the channel rate process data demodulation part described the first aspect is canceled when it is confirmed that no defect is detected in a prescribed section. Therefore, the data demodulation process rate is not frequently changed, thereby realizing a stable system which gives priority over the quality of demodulation data for defects.

According to a fifteenth aspect of the present invention, in the optical disk reproducing device as defined in the fourteenth aspect, the process rate switching part generates the process rate switching signal so that the half rate process data demodulation part is selected in a normal reproduction state; the half rate process data demodulation part is switched to the channel rate process data demodulation part when the amplitude detection part detects a defect of a prescribed length; and thereafter the selection of the channel rate process data demodulation part is canceled when it is judged that the length of the defect gets shorter than a prescribed length. Therefore, the demodulation process rate can be previously estimated even for a part where reproduction is performed for the first time, whereby the data demodulation can be performed smoothly for defects.

According to a sixteenth aspect of the present invention, in the optical disk reproducing device as defined in any of the first to third aspects, the process rate switching part has a tilt information detection part for detecting tilt information indicating a degree of an influence of a tilt angle between a perpendicular to the recording surface of the optical recording medium and an optical axis of a laser beam, exerted on a quality of a reproduction signal according to the magnitude of the tilt angle, and generates the process rate switching signal so that the channel rate process data demodulation part described the first aspect is selected when it is judged from the tilt information obtained by the tilt information detection part that the tilt angle is large; and that the half rate process data demodulation part described the first aspect is selected when it is judged that the tilt angle is small. Therefore, the quality of demodulation data can be maintained in a favorable state even when the quality of a reproduction signal is deteriorated by tilt.

According to a seventeenth aspect of the present invention, in the optical disk reproducing device as defined in a sixteenth aspect, the tilt information detection part receives each filter coefficient value which is learned when an adaptive control is performed so that a square mean value of an equalization error of the equalization output signal that is outputted from the process rate variable type transversal filter described in the third aspect has a minimum value, and detects a degree of deviation in a filter coefficient at a side tap, thereby detecting the tilt information. Therefore, tilt information is judged accurately, whereby reduced power consumption is achieved while the quality of demodulation data is maintained in a favorable state.

According to an eighteenth aspect of the present invention, in the optical disk reproducing device as defined in the seventeenth aspect, the tilt information detection part judges that the tilt angle is large under conditions that, when the filter coefficient at the side tap is compared with a filter coefficient located symmetrically with respect to the center tap, a ratio therebetween which is obtained by absolute value conversion differs by more than a prescribed value. Therefore, the data demodulation process rate can be controlled according to a degree of deterioration in a reproduction signal which is caused by tilt, whereby the data demodulation process employing the channel bit frequency is performed only in case of need, resulting in reduced power consumption and a stable system.

According to a nineteenth aspect of the present invention, in the optical disk reproducing device as defined in any of the first to third aspects, the process rate switching part has a jitter information detection part for detecting jitter information as an index relating to a phase deviation which is generated when digital data is recorded on the optical recording medium, and generates the process rate switching signal so that the channel rate process data demodulation part described the first aspect is selected when it is judged from the jitter information obtained by the jitter information detection part that jitter in a reproduction signal is large, and the half rate process data demodulation part described the first aspect is selected when it is judged that the jitter is small. Therefore, the quality of demodulation data can be maintained in a favorable state when the quality of a reproduction signal is deteriorated due to large jitter.

According to a twentieth aspect of the present invention, in the optical disk reproducing device as defined in the nineteenth aspect, the jitter information detection part receives information which is obtained by averaging absolute values of phase error information employed in the channel rate process phase locked loop part described in the third aspect and the half rate process phase locked loop part described in the third aspect, in a prescribed period, and judges that the jitter is large when the averaged information is equal to or higher than a prescribed level, and judges that the jitter is small when the averaged information is equal to or lower than the prescribed level. Therefore, jitter information can be judged accurately, whereby power consumption is reduced while the quality of demodulation data is maintained in a favorable state.

According to a twenty-first aspect of the present invention, in the optical disk reproducing device as defined in the twentieth aspect, the jitter information detection part receives information which is obtained by dividing the information obtained by averaging the absolute values of the phase error information in the prescribed period, by the amplitude information averaged in the prescribed period, which is obtained by the amplitude detection part described in the eighth aspect, in consideration of dependence of the jitter information upon an amplitude value in a reproduction waveform, and judges that jitter is large when the jitter information is equal to or higher than a prescribed level, and judges that the jitter is small when the jitter information is equal to or lower than the prescribed level. Therefore, jitter information can be accurately judged independently of an amplitude of a reproduction signal, whereby, as compared with the invention as described in the twentieth aspect, power consumption is further reduced while the quality of demodulation data is maintained in a favorable state.

According to a twenty-second aspect of the present invention, in the optical disk reproducing device as defined in any of the first to third aspects, the process rate switching part has a retrial information detection part for detecting retrial process information which indicates a re-reading process for a part where demodulation of data from the optical recording medium has failed, and generates the process rate switching signal so that the half rate process data demodulation part described the first aspect is selected in a normal reproduction state; and that the half rate process data demodulation part is switched to the channel rate process data demodulation part described the first aspect when the retrial information detection part judges that a retrial process occurs. Therefore, the quality of demodulation data at a part where the quality of a reproduction signal is deteriorated so that a retrial process occurs can be maintained in a favorable state.

According to a twenty-third aspect of the present invention, in the optical disk reproducing device as defined in the twenty-second aspect, the process rate switching part: has a retrial position storage part for storing information of a position where the retrial process occurs according to the retrial information detection part, refers to the retrial information stored in the retrial position storage part when data demodulation is performed again for a position where reproduction has been performed once, and generates the process rate switching signal so that the channel rate process data demodulation part is selected in advance for a part where the retrial process has been performed at least once. Therefore, the data demodulation process rate can be switched previously for a part where a retrial process has been performed at least once, whereby the accuracy of data demodulation at second or subsequent times is increased and a reading performance is stabilized.

According to a twenty-fourth aspect of the present invention, in the optical disk reproducing device as defined in the twenty-second aspect, the process rate switching part has: the retrial information detection part for detecting retrial process information in a data demodulation process, and generates the process rate switching signal so that the half rate process data demodulation part is selected in a normal reproduction state; that the half rate process data demodulation part is switched to the channel rate process data demodulation part when the retrial information detection part judges that a retrial process occurs; and thereafter that the selection of the channel rate process data demodulation part is canceled when it is confirmed that no retrial process occurs in a prescribed section. Therefore, the data demodulation process rate is not frequently changed, thereby realizing a stable system which gives priority over the quality of the demodulation data for a part where the data demodulation is difficult.

According to a twenty-fifth aspect of the present invention, in the optical disk reproducing device as defined in the twenty-second aspect, the process rate switching part: has the retrial information detection part for detecting the retrial process information in a data demodulation process, and a reproduction multiple speed varying part for varying a reproduction multiple speed; generates the process rate switching signal so that the half rate process data demodulation part is selected at the highest reproduction multiple speed of this optical disk device in a normal reproduction state, and the half rate process data demodulation part is switched to the channel rate process data demodulation part without changing the reproduction multiple speed when the retrial information detection part judges that a retrial process occurs; and thereafter repeats the retrial process up to a prescribed number of times, and, when data demodulation cannot be performed, further repeats the retrial process up to the prescribed number of times by reducing the reproduction multiple speed by means of the reproduction multiple speed varying part, whereby the retrial process is repeated until the reproduction multiple speed becomes the lowest reproduction multiple speed of the optical disk reproducing device. Therefore, the data demodulation process rate can be switched so that priority is given over the quality of the demodulation data with respect to a part where the data demodulation is difficult, whereby the number of times of the retrial process is reduced.

According to a twenty-sixth aspect of the present invention, in the optical disk reproducing device as defined in the twenty-second aspect, the process rate switching part: has the retrial information detection part for detecting the retrial process information in a data demodulation process, and a reproduction multiple speed varying part for varying a reproduction multiple speed; and generates the process rate switching signal so that the half rate process data demodulation part is selected at the highest reproduction multiple speed of this optical disk reproducing device in a normal reproduction state, the retrial process is repeated with reducing the reproduction multiple speed by means of the reproduction multiple speed varying part when the retrial information detection part judges that the retrial process has been repeated up to a prescribed number of times, the reproduction multiple speed is further reduced to the lowest reproduction multiple speed of the optical disk reproducing device when data demodulation cannot be performed, and the half rate process data demodulation part is switched to the channel rate process data demodulation part when the retrial process does not converge within the prescribed number of times, at the lowest reproduction speed. Therefore, the data demodulation process rate can be switched so that priority is given over reduction of power consumption with respect to a part where the data demodulation is difficult, whereby the power consumption for the entire retrial process is reduced.

According to a twenty-seventh aspect of the present invention, in the optical disk reproducing device as defined in the twenty-second aspect, the process rate switching part: has the retrial information detection part for detecting the retrial process information in a data demodulation process, and a reproduction multiple speed varying part for varying a reproduction multiple speed; and generates the process rate switching signal so that the reproduction multiple speed is increased by the reproduction multiple speed varying part when it is confirmed that no retrial process occurs in a prescribed section in a state where the channel rate process data demodulation part is selected and the reproduction multiple speed does not reach the highest reproduction multiple speed of the optical disk reproducing device, and the channel rate process data demodulation part is switched to the half rate process data demodulation part when it is confirmed that no retrial process occurs in the prescribed section at the highest reproduction multiple speed. Therefore, when a reproduction multiple speed is lower than the highest reproduction multiple speed, and a function of performing a data demodulation process employing the channel bit frequency is selected at a retrial process for a part where the data demodulation is difficult, a reproduction multiple speed varying process and switching of a data demodulation process rate can be performed so that priority is given over the quality of the demodulation data, whereby a normal reproduction state can be restored quickly.

BRIEF DESCRIPTION OF DRAWINGS

FIG. 5(a) is a diagram illustrating an output waveform from a waveform equalization means. FIG. 5(b) is a diagram illustrating a sampling signal at binarization judgement. FIG. 5(c) is a diagram illustrating a PR (a, b, b, a) equalization output signal.

FIG. 9(a) is a diagram illustrating a state where frequency of a reproduction clock is slightly lower than a clock component of reproduction data. FIG. 9(b) is a diagram illustrating a state where phase of the reproduction clock is synchronized with phase of the clock component of reproduction data.

FIG. 10(a) is a diagram illustrating a state transition.

FIG. 11(a) is a diagram illustrating a change of sampling frequency according to a reproduction position at CAV reproduction in a process employing channel bit frequency. FIG. 11(b) is a diagram illustrating a sampling frequency when a process rate is switched between an inner circumference and an outer circumference.

FIGS. 13(a)–13(d) are a block diagram illustrating the construction of an amplitude detection means 33 according to the second embodiment, as well as explanatory diagrams of a principle of operation of a process rate switching means

14. FIG. 13(*b*) is a diagram illustrating a reproduction signal as input to the amplitude detection means. FIG. 13(*c*) is a diagram illustrating amplitude information which is obtained by the amplitude detection means. FIG. 13(*d*) is a diagram illustrating defect information which is generated from the amplitude information in FIG. 13(*c*).

FIG. 16(*a*) is a diagram illustrating a case where it is judged that a defect exists at a position where the defect actually exists as well as in an area surrounding that position with a prescribed distance therefrom. FIG. 16(*b*) is a diagram illustrating a case where it is judged that a defect exists at a position where the defect actually exists as well as in the entire recording track where the defect exists.

FIGS. 28(*a*)–28(*d*) are explanatory diagrams of recorded data and output signal waveforms at respective functional blocks according to the conventional optical disk reproducing device. FIG. 28(*a*) is a diagram illustrating digital recording codes recorded so as to have a constant linear recording density. FIG. 28(*b*) is a diagram illustrating a high-frequency-emphasized reproduction signal. FIG. 28(*c*) is a diagram illustrating sampled data which is suited for a PRML signal process system. FIG. 28(*d*) is a diagram illustrating an equalized output signal which is multi-valued by applying partial response equalization.

DETAILED DESCRIPTION OF THE INVENTION

Hereinafter, optical disk reproducing devices according to a first to fifth embodiments of the present invention will be described with reference to the drawings.

Embodiment 1

An optical disk reproducing device according to a first embodiment, which performs demodulation of digital data recorded on an optical disk medium by a digital signal process, by applying a PRML signal process system which is assumed to be effective in high recording density reproduction in the linear direction, varies a data demodulation process rate, thereby reducing power consumption while maintaining a quality of digital demodulation data and a reading performance in a favorable state, even when a signal-noise ratio is deteriorated and a quality of a reproduction signal is locally deteriorated as well dependently on a tilt or a defect.

Hereinafter, the optical disk reproducing device corresponding to the first embodiment will be described with reference to FIGS. 1 to 11(*b*).

Figure 1:
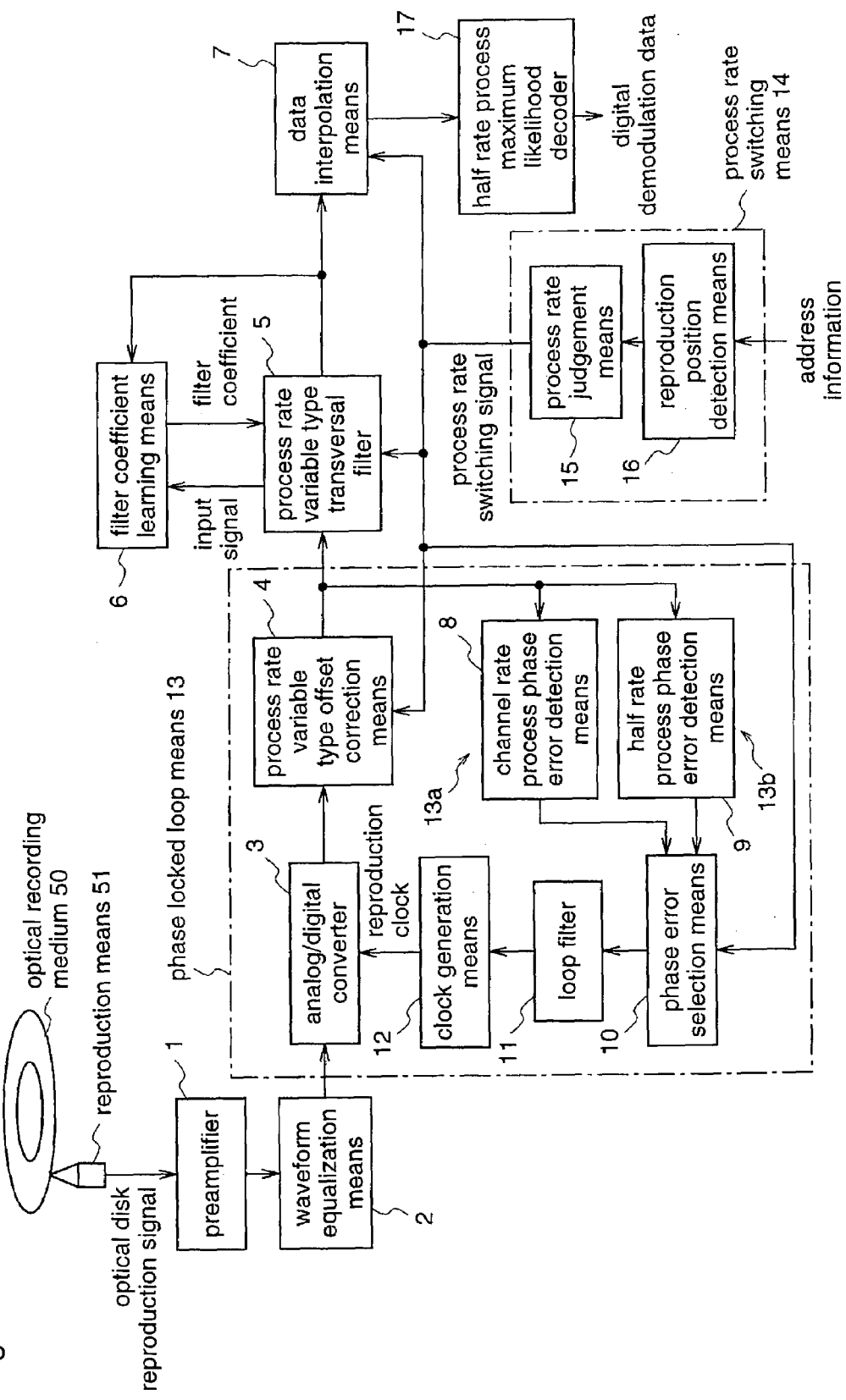
FIG. 1 is a block diagram illustrating the construction of a process rate variable type optical disk reproducing device according to a first embodiment of the present invention.
Figure 2:
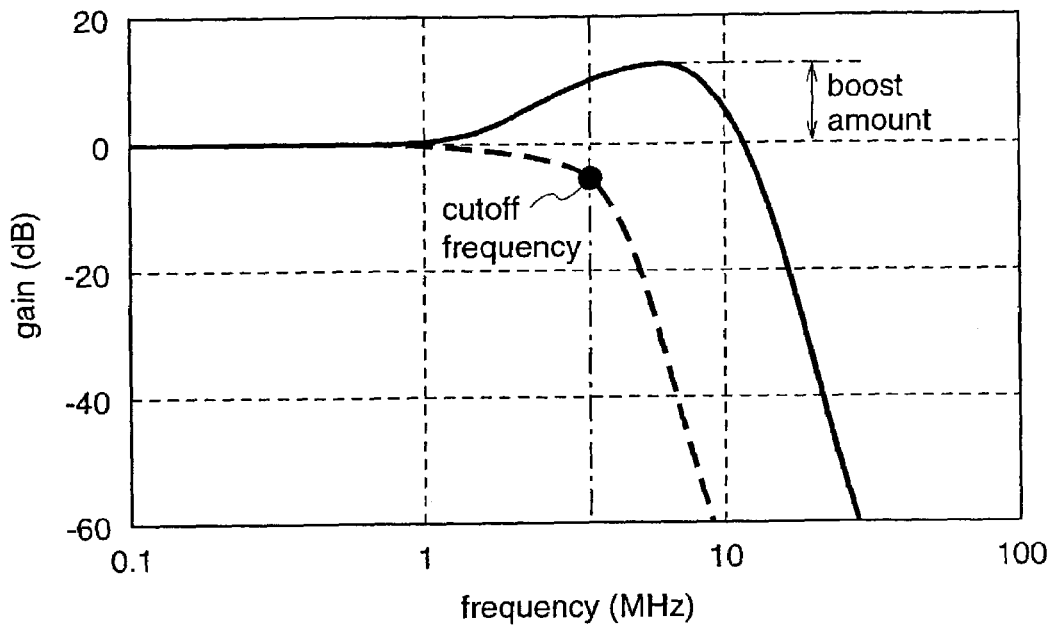
FIG. 2 is an explanatory diagram of frequency characteristics of a high-order eq-ripple filter.

In FIG. 1, an output amplitude of an optical disk reproduction signal which is reproduced from an optical recording medium 50 by a reproduction means 51 is emphasized by a preamplifier 1, and thereafter, the optical disk reproduction signal is corrected by a waveform equalization means 2 so that a high frequency band thereof is emphasized. The waveform equalization means 2 comprises a filter which enables a boost amount and a cutoff frequency to be set arbitrarily. This waveform equalization means 2 may be realized by, for example, a high-order ripple filter or the like, which has frequency characteristics as shown as a solid line in FIG. 2. In FIG. 2, a dotted line shows characteristics when a gain of an input signal is not boosted.

Figure 3:
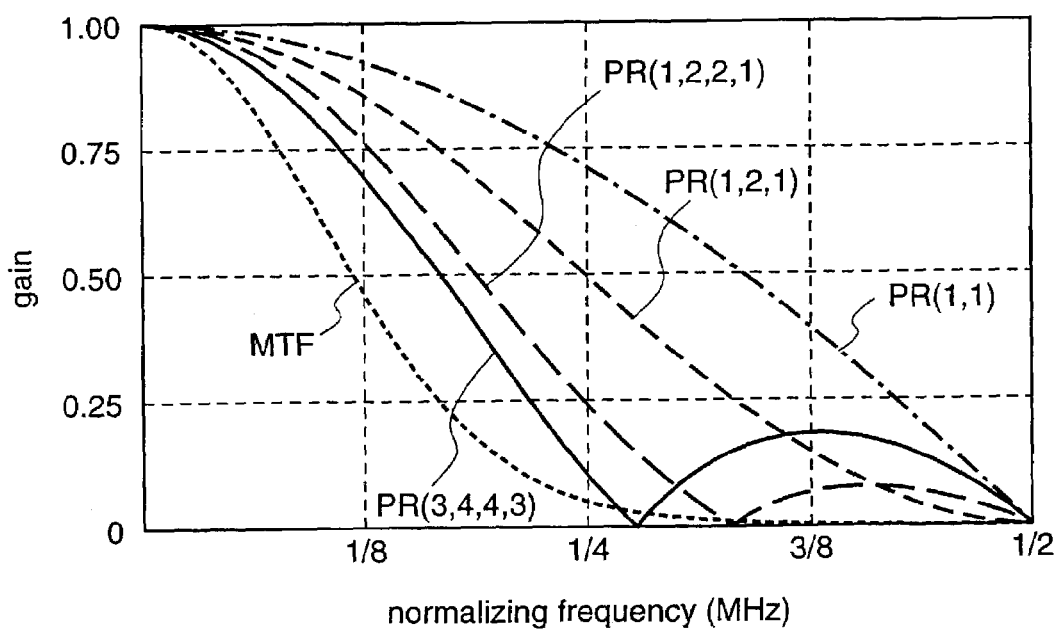
FIG. 3 is a diagram illustrating frequency characteristics and MTF characteristics of various kinds of partial response systems.

Next, an output signal from the waveform equalization means 2 is sampled into a multi-bit digital signal by an analog/digital converter 3 which is a means for converting an analog signal into a digital signal. The analog/digital converter 3 performs sampling by employing a reproduction clock which is generated by a clock generation means 12. At this time, in cases where a code of digital data to be demodulated is one in which the minimum run-length is limited to "2", like, for example, an 8–16 modulation code employed for a DVD, and MTF (Mutual Transfer Function; hereinafter, abbreviated as "MTF") characteristics as optical reproduction characteristics are distributed in a band which is almost a quarter or less of a channel bit frequency as shown in FIG. 3, digital data can be demodulated theoretically according to a sampling theorem, even when sampling is performed by the analog/digital converter 3 by employing a reproduction clock which has a frequency component half as high as the channel bit frequency.

By utilizing this, the present invention enables the selection between a case where a reproduction clock is generated on the basis of the same frequency as the channel bit frequency, and a case where a reproduction clock is generated on the basis of the frequency which is half as high as the channel bit frequency. This sampled multi-bit digital signal is inputted to a process rate variable type offset correction means 4, thereby correcting an offset component included in the reproduction digital signal.

Figure 4:
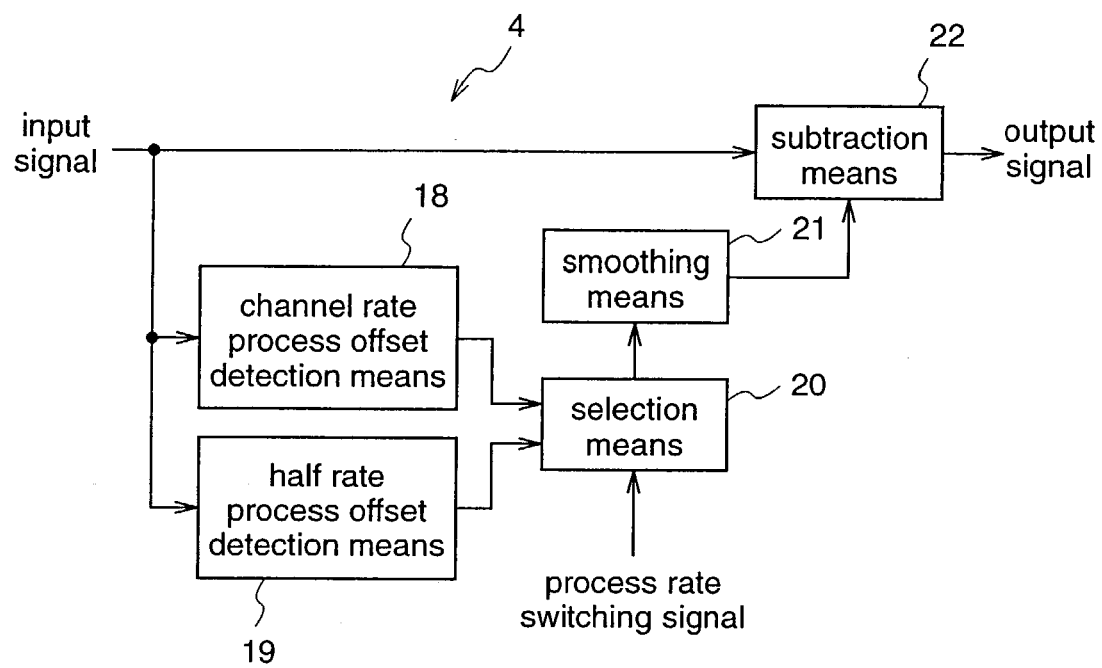
FIG. 4 is a block diagram illustrating the construction of a process rate variable type offset correction means 4 according to the first embodiment.

As shown in FIG. 4, the process rate variable type offset correction means 4 may be realized by a channel rate process offset detection means 18 for detecting an offset component of the reproduction digital signal by a clock which is generated on the basis of the channel bit frequency, a half rate process offset detection means 19 for detecting an offset component of the reproduction digital signal by a clock which is generated on the basis of the frequency half as high as the channel bit frequency, a selection means 20 for selecting either one output signal from the channel rate process offset detection means 18 or the half rate process offset detection means 19, by a process rate switching signal which is generated by a process rate switching means 14 in FIG. 1, a smoothing means 21 for smoothing the selected offset signal, and a subtraction means 22 for subtracting an output signal from the smoothing means 21 from the reproduction digital signal.

Next, an output signal from the process rate variable type offset correction means 4 is inputted to a process rate variable type transversal filter 5 to be subjected to partial response equalization. Here, partial response equalization employs a PR (a, b, b, a) system in which, for example, a reproduction signal of a DVD has its waveform amplitude after equalization divided into five values as shown in FIG. 5(c). Black circles "●" and white circles "○" in FIGS. 5(b) and 5(c) indicate data sampled by a reproduction clock. When sampling is performed by employing a clock which is generated on the basis of the same frequency as the channel bit frequency, the signal comprises both sampled data "●" and "○". On the other hand, when sampling is performed by employing a clock which is generated on the basis of the frequency half as high as the channel bit frequency, the signal comprises either one sampled data "●" or "○".

Conventionally, in a lead channel employed for optical disk reproduction, a waveform-equalized output signal as shown in FIG. 5(a) is subjected to binarization judgement with the center level thereof as a slice level, whereby digital data demodulation is performed. Further, sampling is performed at prescribed sections as shown in FIG. 5(b), and a sampled multi-bit digital signal is subjected to binarization judgement with the center level thereof as a slice level.

On the other hand, according to the PR (a, b, b, a) system, a signal in which sampling data of four different times are added at a rate a:b:b:a (a+b*D+b*D2+a*D4) is generated, and characteristics corresponding to a low-pass filter as shown in FIG. 3 are added to a reproduction signal. In FIG. 3, a PR (1, 2, 2, 1) system and a PR (3, 4, 4, 3) system correspond to this system.

It is thought that a partial response system that has frequency characteristics nearer to the MTF characteristics shown in FIG. 3 is a more favorable system. In addition to the systems shown in FIG. 3 including the PR (a, b, b, a) system, there exist various types of partial response systems. It is not restricted to a filter of a specific system, and filters of other types may be also employed as long as they achieve a desired equalization performance. A partial response system which adds correlation in the direction of time of reproduction data, and a viterbi decoder, as one of after-mentioned maximum likelihood decoding methods, which estimates the most likely series by utilizing the added data correlation are used together, whereby the PRML signal process which is supposed to be advantageous in high-density recording/reproduction in the linear recording direction is realized.

As described above, since various PRML signal process systems exist according to characteristics of a reproduction waveform or a modulation code, an appropriate system should be selected for a recording/reproduction system of each kind. A process rate variable type transversal filter 5 may be realized by, for example, an FIR (Finite Impulse Response; hereinafter, abbreviated as "FIR") filter which comprises finite taps. Equalization characteristics obtained by the FIR filter are achieved by varying a filter coefficient.

Figure 6:
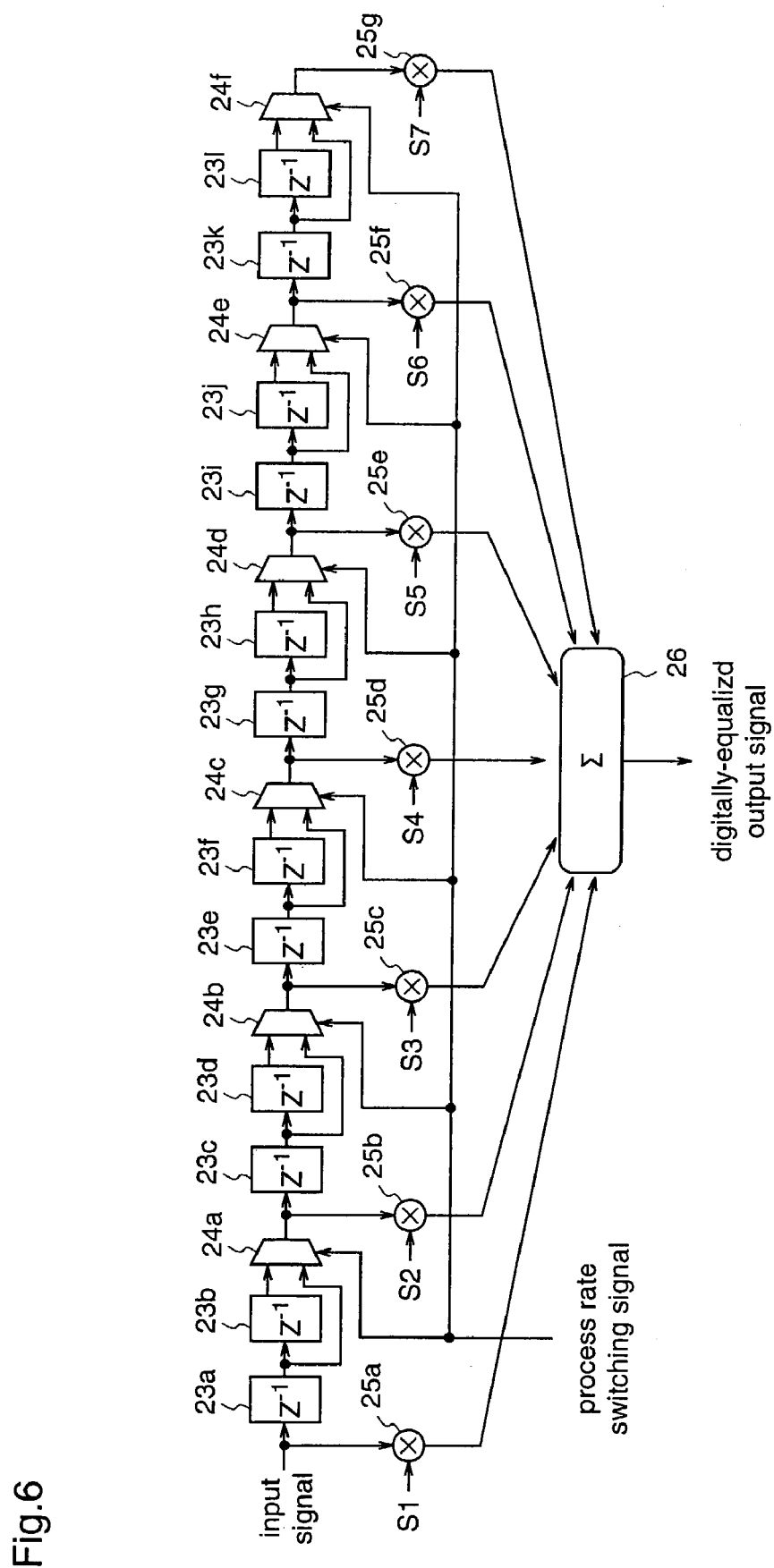
FIG. 6 is a block diagram illustrating the construction of the process rate variable type transversal filter 5 according to the first embodiment.

The FIR filter may be realized by delay elements 23a to 23l for delaying for one cycle of a reproduction clock, selectors 24a to 24f for selecting output signals from the delay elements 23a to 23l by a process rate switching signal generated by the process rate switching means 14 in FIG. 1, multiplication elements 25a to 25g, and an addition means 26, as shown in FIG. 6.

The delay elements 23a to 23l are serially connected each other. The selectors 24a, 24b, 24c, 24d, and 24e are provided between the delay elements 23b and 23c, the delay elements 23d and 23e, the delay elements 23f and 23g, the delay elements 23h and 23i, and the delay elements 23j and 23k, respectively, and the selector 24f is provided in the stage subsequent to the delay element 23l. The selector 24a selects either one output signal from the delay element 23a or 23b, and outputs the selected signal to the delay element 23c in the subsequent stage. Each of the other selectors 24b to 24e also selects either one output signal from the delay element in the previous stage or that in the stage preceding the previous stage, and outputs the selected signal to the delay element in the subsequent stage. The selector 24f selects either one output signal from the delay element in the previous stage or that in the stage preceding the previous stage. The multiplication element 25a multiplies an input signal to the FIR filter by a filter coefficient S1. The multiplication element 25b multiplies a filter coefficient S2 by an output signal from the selector 24a. In a like manner as the multiplication element 25b, the multiplication elements 25c to 25g also multiply filter coefficients S3 to S7 by output signals from the selectors 24b to 24f, respectively. The addition means 26 adds output signals from the multiplication elements 25a to 25g.

The filter coefficients S1 to S7 of the FIR filter are set by a filter coefficient learning means 6 that utilizes an LMS algorithm for adaptively performing control so that an equalization error existing in a partial response equalization output signal outputted from the process rate variable type transversal filter 5 has a minimum value.

Figure 7:
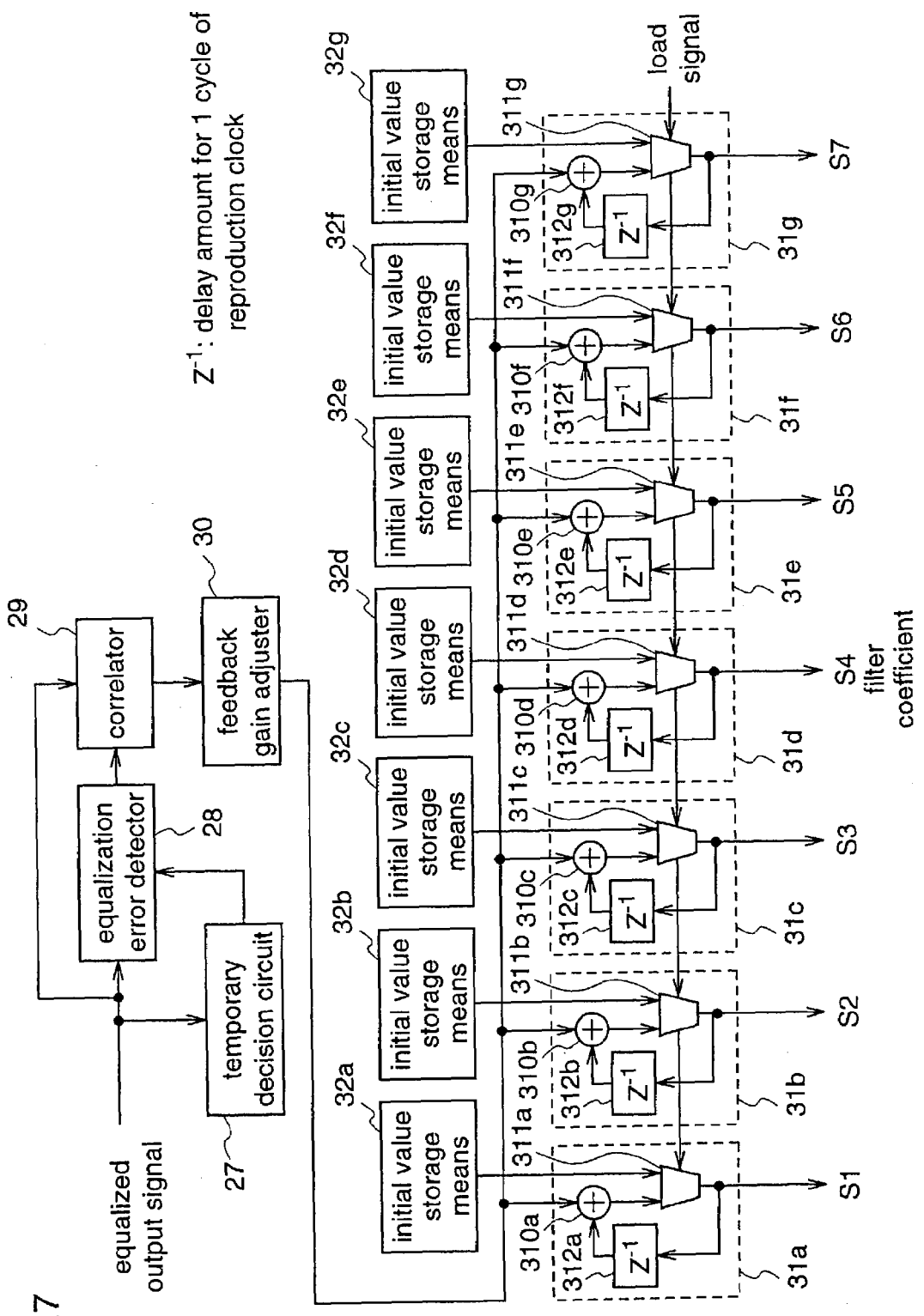
FIG. 7 is a block diagram illustrating the construction of a filter coefficient learning means 6 according to the first embodiment.

For example, as shown in FIG. 7, the filter coefficient learning means 6 may be realized by an equalization error detector 28 which performs subtraction with an equalization target value corresponding to a partial response system, which is detected from the equalization output signal from the process rate variable type transversal filter 5 by a temporary decision circuit 27, and the output signal from the process rate variable type transversal filter 5, thereby detecting an equalization error; a correlator 29 for computing the correlation between the output signal from the equalization error detector 28 and the equalization output signal from the process rate variable type transversal filter 5; a feedback gain adjuster 30 for adjusting a feedback gain by increasing output from the correlator 29 by the same number of times as the number of gain; and filter coefficient updating parts 31a to 31g as means for updating filter coefficients by adding an output from the feedback gain adjuster 30 to filter coefficients of respective taps. The filter coefficient learning means 6 constructed as described above also has a function of performing adaptive automatic equalization control of the filter coefficient by loading initials value of the filter coefficients stored in initial value storage means 32a to 32g.

The filter coefficient updating part 31a selects one from an output signal from the initial value storage means 32a and an output signal from an adder 310a, with a selector 311a, outputs the output signal from the selector 311a as the filter coefficient S1 as well as receives the output signal from the selector 311a with one input of the adder 310a through a delay element 312a, and receives the output signal from the above-described feedback gain adjuster 30 with the other input of the adder 310a. The other filter coefficient updating parts 31b to 31g are similarly constructed.

Figure 8:
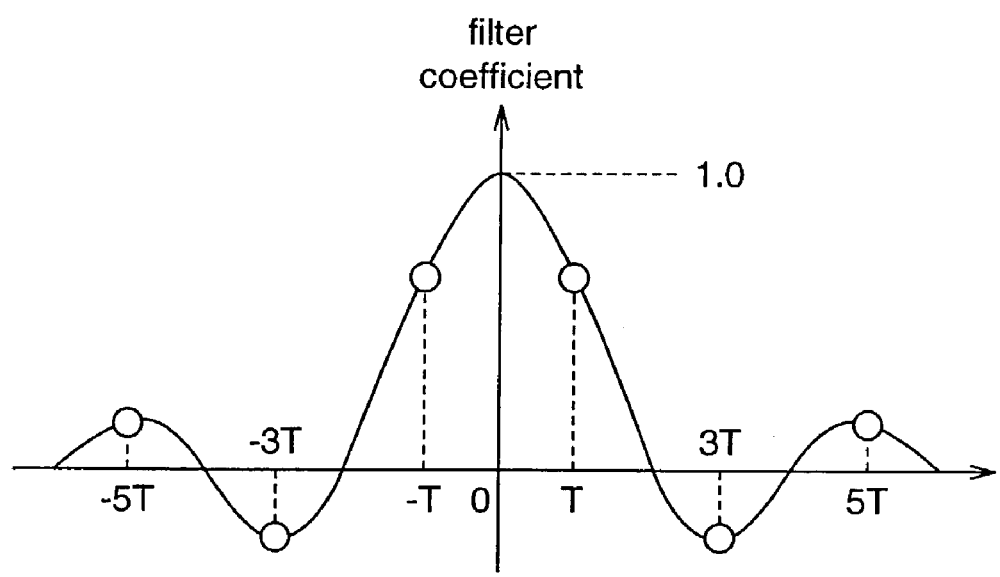
FIG. 8 is an explanatory diagram of a principle of operation of a data interpolation means 7 according to the first embodiment.

The output signal from the FIR filter comprises both black circles "●" and white circles "○" in FIG. 5(c) when the signal is processed by employing the channel bit frequency, while comprises either black circles "●" or white circles "○" in FIG. 5(c) when the signal is processed by employing the frequency half as high as the channel bit frequency. Accordingly, with respect to an output signal which is subjected to partial response equalization by employing the frequency half as high as the channel bit frequency, intermediate data lacking at sampling is interpolated by a data interpolation means 7. The data interpolation means 7 may be realized by, for example, a filter having Nyquist characteristics as shown in FIG. 8. In this case, filter coefficients as indicated by white circles "○" in FIG. 8 which are placed at intervals of twice as long a cycle as a channel bit cycle are applied, whereby lacking data can be restored by Nyquist interpolation.

When a reproduction clock is generated by the process rate switching means 14 in FIG. 1 on the basis of the channel bit frequency, a phase error is detected from an output signal generated from the analog/digital converter 3 and the process rate variable type offset correction means 4, by channel rate process phase error detection means 8. When a reproduction clock is generated by the process rate switching means 14 on the basis of the frequency half as high as the channel bit frequency, a phase error is detected by half rate process phase error detection means 9.

Either one of phase error signals detected by the channel rate process phase error detection means 8 and the half rate process phase error detection means 9 is selected by phase error selection means 10 according to a process rate switching signal, and thereafter, the selected phase error signal is outputted to the clock generation means 12 through a loop filter 11 for smoothing the phase error signal, and the clock generation means 12 is controlled so that the phase of the reproduction clock is synchronized with phase of a clock component of the reproduction signal, on the basis of the output signal from the loop filter 11.

There is provided a phase locked loop means 13 which performs sampling of a reproduction waveform with the analog/digital converter 3 by employing the reproduction clock generated through the path that starts at the analog/digital converter 3 and ends at the clock generation means 12, whereby a multi-bit sampling signal which is synchronized with the phase of the clock component of the reproduction signal is generated. In this way, the PRML signal process is realized.

Here, a channel rate process phase locked loop means 13a may indicate a phase locked loop which detects a phase error by the channel rate process phase error detection means 8, and a half rate process phase locked loop means 13b may indicate a phase locked loop which detects a phase error by the half rate process phase error detection means 9.

The phase locked loop means 13 may be realized as one which makes the phase of the clock component of the reproduction data synchronized with the phase of the reproduction clock on the basis of a principle as shown in FIGS. 9(a) and 9(b).

A description will be given of a case where phase synchronization is performed by employing the channel rate process phase error detection means 8, as an example. FIG. 9(a) shows a state where a frequency of a reproduction clock is slightly lower than a frequency of a clock component of reproduction data. For example, it is assumed that the reproduction data comprises continuous single frequency of 4T ("T" is a time corresponding to 1 channel bit). With respect to a sampling signal in the vicinity of zero crossing level which is indicated by black circles "●" in FIG. 9(a), information is kept as it is at a rising edge of the sampling signal, while positive and negative of the sampling signal is inverted at a falling edge, whereby phase error curves shown in FIGS. 9(a) and 9(b) are observed according to a phase deviation amount. Here, an amplitude component of the sampling signal can be thought of as a sampling phase deviation in the time direction. Then, it is assumed that the amplitude component of the sampling signal in the vicinity of zero crossing level is considered as a phase error signal as it is in consideration of a rising edge and a falling edge. When the signal is observed as being positive, phase is delayed and, thus, the frequency of the reproduction clock is increased to feed back the signal in the direction in which the phase is advanced. On the other hand, when the signal is observed as being negative, phase is advanced and, thus, the frequency of the reproduction clock is reduced to feed back the signal in the direction in which the phase is delayed. According to this control, as shown in FIG. 9(b), the phase error signal approaches zero, and the phase of the reproduction clock can be synchronized with the phase of the clock component of reproduction data.

On the other hand, when phase synchronization is performed by employing the half rate process phase error detection means 9, the sampled data shown in FIGS. 9(a) and 9(b) exists alternately due to sampling that employs the frequency half as high as the channel bit frequency. Therefore, a phase error curve can be obtained with respect to parts where the sampling data exists as in the case of employing the channel rate process phase error detection means 8.

The process rate switching signal which is supplied to the above-described respective blocks is generated by the process rate switching means 14. Here, for example, the process rate switching means 14 may be realized as one which detects a reproduction position in the inner or outer circumference of the optical disk, from address information detected from modulation data, by a reproduction position detection means 16, and generates the process rate switching signal by a process rate judgement means 15 on the basis of the detected position information.

At this time, for example, when data is spirally recorded from the inner circumference of the optical disk toward the outer circumference, the reproduction position detection means 16 may be realized as one which calculates a physical position where data as a demodulation target exists, on the basis of the address information, channel bit length, and data in recording track width, which exist for data of each prescribed number.

The partial response equalization signal outputted by a series of operations as described above is inputted to a half rate process maximum likelihood decoder 17 for performing decoding according to the type of partial response, whereby data demodulation is performed. Here, the half rate process maximum likelihood decoder 17 may be realized by, for example, a viterbi decoder for performing a demodulation process by employing the frequency half as high as the channel bit frequency.

The viterbi decoder performs probability calculation on the basis of the law of correlation of a code which is added intentionally according to the type of partial response, and estimates the most likely series. For example, when the type of an applied partial response is the PR (a, b, b, a) system, a state changes on the basis of a state transition diagram as shown in FIG. 10(a). Here, particularly, an 8–16 modulation code which is employed for a DVD is taken into account, and the change of state can be expressed in six states of transition from S0 to S5 in connection with the fact that the minimum run-length is limited to "2".

In FIG. 10(a), with respect to X/Y, "X" indicates a transition of a recording code, and "Y" indicates a signal amplitude at that time. One state is indicated by a code of neighboring three times. For example, in a state transition from S4 "110" to S3 "100", a code "0" is added to the state S4 "110" to shift the same to the left, thereby "1" at the far left disappears, resulting in the state S3 "100". However, when a process rate has the frequency half as high as the channel bit frequency, two neighboring states should be considered as one in the state transition shown in FIG. 10(a).

For example, when the data interpolation means 7 outputs data at a normal sampling position in parallel with interpolation data which is restored by interpolation, as an output signal, the data at a normal sampling position and the interpolation data may be respectively inputted to two neighboring states, whereby a parallel processing is performed. A temporal change at that time is shown in a trellis diagram as shown in FIG. 10(b) in which the normal data and the interpolation data are processed in parallel. Then, the probabilistic length of each path "lkab" (hereinafter, referred to as "branch metric") is calculated, and the branch metric is added when there is a transition to each state. Here, "k" indicates temporal transition, and "ab" indicates a branch metric in transition from a state "Sa" to a state "Sb". A value of the branch metric added at each state is referred to as a "metric", and a path which has the minimum metric is sequentially outputted as a remaining path, thereby demodulating into binary digital data. That is, when it is assumed that demodulation is performed according to the recording code in FIG. 10(b), a path shown as a solid line is a remaining path.

Here, a channel rate process data demodulation means 13a may be realized so that the process rate switching means 14 generates a process rate switching signal to perform a data demodulation process by mainly employing the channel bit frequency, and in the phase locked loop means 13, the channel rate process offset detection means 18 in the process rate variable type offset correction means 4, and the channel rate process phase error detection means 8 are selected, and the process rate variable type transversal filter 5 operates on the basis of the channel bit frequency, and an output signal therefrom passes through the data interpolation means 7 and is subjected to digital data demodulation by the half rate process maximum likelihood decoder 17.

Further, a half rate process data demodulation means 13b may be realized so that the process rate switching means 14 generates a process rate switching signal to perform a data demodulation process by employing the frequency half as high as the channel bit frequency, and in the phase locked loop means 13, the half rate process offset detection means 19 in the process rate variable type offset correction means 4, as well as the half rate process phase error detection means 9 are selected, and the process rate variable type transversal filter 5 operates on the basis of the frequency half as high as the channel bit frequency, and an output signal therefrom passes through the data interpolation means 7 and is subjected to digital data demodulation by the half rate process maximum likelihood decoder 17.

By a series of measures as described above, which make full use of the characteristics of the 8–16 modulation code or the like to switch a process rate for the PRML signal process by the process rate switching means 14 according to a position in the inner or outer circumference of the optical disk, a data demodulation process can be performed at the frequency half as high as the channel bit frequency in the case of high multiple speed reproduction that causes an increase in power consumption, thereby reducing power consumption by nearly half. Further, a maximum likelihood decoder or the like which theoretically causes no deterioration in the demodulation performance can perform the process employing the frequency half as high as the channel bit frequency at all times, whereby only a half rate process circuit is required and there is no need to provide an additional channel bit frequency circuit, resulting in reduction in the circuit scale and the power consumption.

The process rate switching means 14 described for the first embodiment may be realized as follows. That is, since the linear velocity of reproduction data varies from the inner circumference of the disk toward the outer circumference according to a position on the disk at CAV (Constant Angular Velocity) reproduction, i.e., data reproduction at constant optical disk rotation, the channel bit frequency is higher on the outer circumference side than on the inner circumference side as shown in FIG. 11(a). Accordingly, when a data process is performed by employing the channel bit frequency, an increase in power consumption becomes a problem at high multiple speed reproduction on the outer circumference side.

To solve this problem, the reproduction position detection means 16 detects a reproduction position from address information indicating an address of the reproduction position on the disk, to judge whether the reproduction position is located in an area from "A" to "C" shown in FIG. 11(b) or in an area from "C" to "B", and the process rate judgement means 15 generates a process rate switching signal so that a data demodulation process is performed by employing the channel bit frequency when the reproduction position is located in the area from "A" to "C" on the inner circumference side, and a data demodulation process is performed by employing the frequency half as high as the channel bit frequency when the reproduction position is located in the area from "C" to "B" on the outer circumference side. Further, "C" as a process rate switching position may be set at an arbitrary position, whereby power consumption can be controlled.

By employing the process rate switching means 14 as described above, a sampling frequency of a reproduction clock can be suppressed to a frequency equal to or lower than half the maximum frequency as shown in FIG. 11(b), thereby reducing power consumption at reproduction on the outer circumference side by the CAV system, which is to be increased. Further, a signal process can be performed in a band of the frequency half as high as that at the highest multiple speed reproduction, whereby a burden of designing the analog/digital converter 3, the clock generation means 12, and a synchronous circuit in a digital circuit can be reduced, resulting in a reduction in circuit scale and cost.

As described above, according to the first embodiment, by utilizing the fact that the minimum change unit of data recorded on the optical disk is 3-channel bit, a process is performed at a rate half as high as a channel bit according to a sampling theorem, thereby providing a function of reducing power consumption at high multiple speed reproduction. Further, while a viterbi decoder which theoretically causes no performance deterioration performs a half rate process at all times, other circuit blocks execute a channel rate process or the half rate process by switching therebetween according to required power consumption and a process performance, whereby power consumption is reduced without deteriorating a reading performance.

Further, the optical disk is divided into the areas of inner circumference and outer circumference, and an address of reproduction part is monitored, thereby providing a function of switching between the channel rate process and the half rate process according to the inner circumference of the optical disk or the outer circumference. When CAV reproduction is performed at high multiple speed, the half rate process is performed on the outer circumference side where a reproduction speed is higher, while the channel rate process is performed on the inner circumference side where a reproduction speed is lower, whereby a high multiple speed reproduction can be performed with reduced power consumption, without deteriorating a reading performance.

Embodiment 2

An optical disk reproducing device according to a second embodiment performs switching of a data demodulation process rate according to defect information relating to an optical recording medium.

Hereinafter, the optical disk reproducing device according to the second embodiment will be described with reference to FIGS. 2 to 9(b) and 12 to 17.

Figure 12:
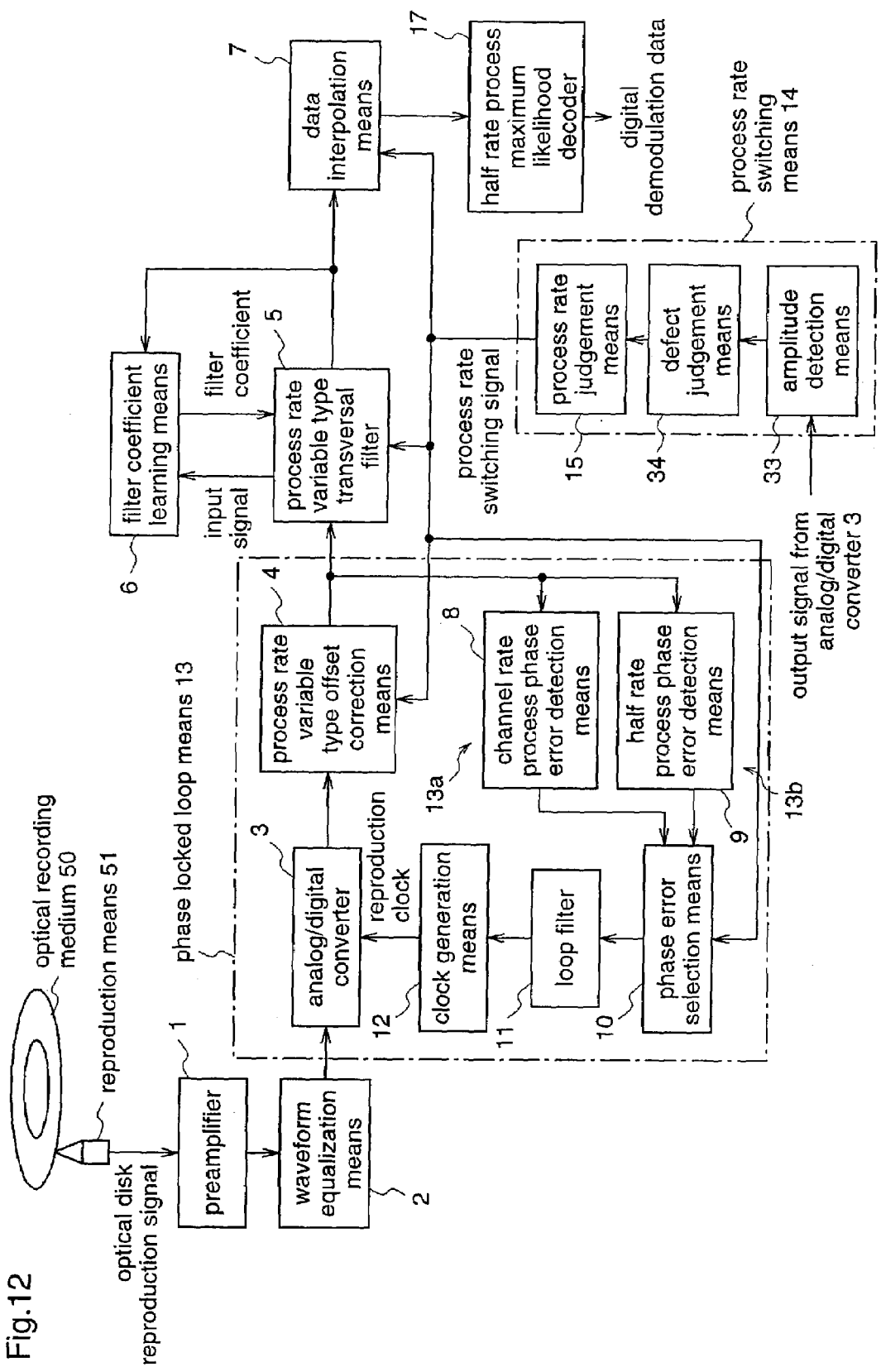
FIG. 12 is a block diagram illustrating the construction of a process rate variable type optical disk reproducing device according to a second embodiment of the present invention.
Figure 13:
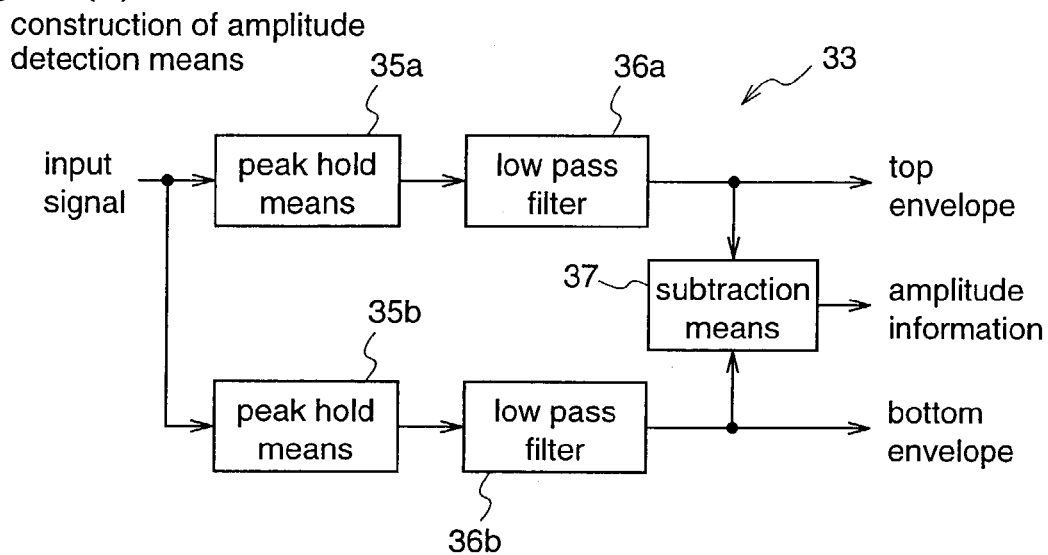
FIG. 13(*a*) is a block diagram illustrating the construction of the amplitude detection means.
Figure 13:
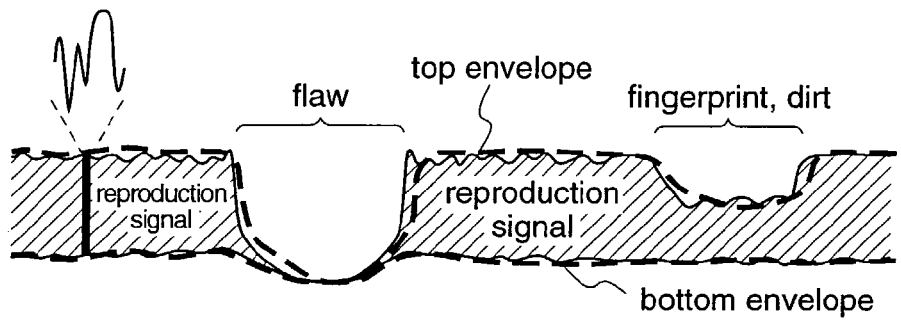
Figure 13:
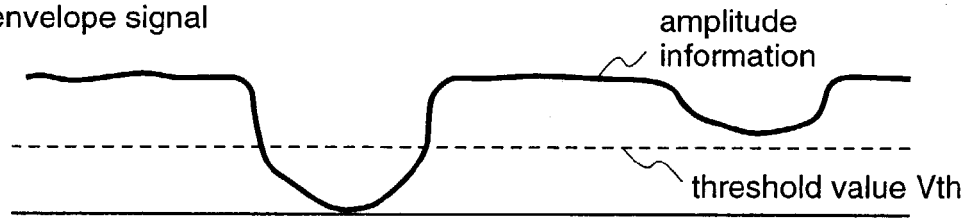
Figure 13:

In FIG. 12, an output amplitude of an optical disk reproduction signal which is reproduced from an optical recording medium 50 by a reproduction means 51 is emphasized by a preamplifier 1, and thereafter the optical disk reproduction signal is corrected by a waveform equalization means 2 so that a high frequency band thereof is emphasized. The waveform equalization means 2 comprises a filter which enables a boost amount and a cutoff frequency to be set arbitrarily. This waveform equalization means 2 may be realized by, for example, a high-order ripple filter or the like, which has frequency characteristics as shown as a solid line in FIG. 2.

Next, an output signal from the waveform equalization means 2 is sampled into a multi-bit digital signal by an analog/digital converter 3 which is a means for converting an analog signal into a digital signal. The analog/digital converter 3 performs sampling by employing a reproduction clock which is generated by a clock generation means 12. At this time, in cases where a code of digital data to be demodulated is one in which the minimum run-length is limited to "2", like, for example, an 8–16 modulation code employed for a DVD, and MTF characteristics as optical reproduction characteristics are distributed in a band which is almost a quarter or less of a channel bit frequency as shown in FIG. 3, digital data can be demodulated theoretically according to a sampling theorem, even when sampling is performed by the analog/digital converter 3 by employing a reproduction clock which has a frequency component half as high as the channel bit frequency.

By utilizing this, the present invention enables the selection between a case where a reproduction clock is generated on the basis of the channel bit frequency, and a case where a reproduction clock is generated on the basis of a frequency which is half as high as the channel bit frequency. This sampled multi-bit digital signal is inputted to a process rate variable type offset correction means 4, thereby correcting an offset component included in the reproduction digital signal. For example, the process rate variable type offset correction means 4 may be realized by one which has the construction as described for the first embodiment in FIG. 4.

Next, an output signal from the process rate variable type offset correction means 4 is inputted to a process rate variable type transversal filter 5 to be subjected to partial response equalization. Here, partial response equalization employs a PR (a, b, b, a) system in which, for example, a reproduction signal of a DVD has its waveform amplitude after equalization divided into five values as shown in FIG. 5(c). Black circles "●" and white circles "○" in FIGS. 5(b)–5(c) indicate data sampled by a reproduction clock. When sampling is performed by employing a clock which is generated on the basis of the same frequency as the channel bit frequency, the signal comprises both sampled data "●" and "○". On the other hand, when sampling is performed by employing a clock which is generated on the basis of the frequency half as high as the channel bit frequency, the signal comprises either one sampled data "●" or "○".

Conventionally, in a lead channel employed for optical disk reproduction, a waveform-equalized output signal as shown in FIG. 5(a) is subjected to binarization judgement with the center level thereof as a slice level, whereby digital data demodulation is performed. Further, sampling is performed at prescribed sections as shown in FIG. 5(b), and a sampled multi-bit digital signal is subjected to binarization judgement with the center level thereof as a slice level.

On the other hand, according to the PR (a, b, b, a) system, a signal in which sampling data of four different times are added at a rate a:b:b:a (a+b*D+b*D2+a*D4) is generated, and characteristics corresponding to a low-pass filter as shown in FIG. 3 are added to a reproduction signal.

It is thought that a partial response system that has frequency characteristics nearer to the MTF characteristics shown in FIG. 3 is a more favorable system. In addition to the systems shown in FIG. 3 including the PR (a, b, b, a) system, there exist various types of partial response systems. It is not restricted to a filter of specific system, and filters of other types may be also employed as long as they achieve desired equalization performance. A partial response system which adds correlation in the direction of time of reproduction data, and a viterbi decoder, as one of after-mentioned maximum likelihood decoding methods, which estimates the most likely series by utilizing the added data correlation are used together, whereby the PRML signal process which is supposed to be advantageous in high-density recording/reproduction in the linear recording direction is realized.

As described above, since various PRML signal process systems exist according to characteristics of reproduction waveform or modulation code, an appropriate system should be selected for a recording/reproduction system of each kind. A process rate variable type transversal filter 5 may be realized by, for example, a FIR filter which comprises finite taps. Equalization characteristics obtained by the FIR filter are achieved by varying a filter coefficient.

For example, the FIR filter may be realized by one as described for the first embodiment in FIG. 6.

The filter coefficients S1 to S7 of the FIR filter are set by a filter coefficient learning means 6 that utilizes an LMS algorithm for adaptively performing control so that an equalization error existing in a partial response equalization output signal outputted from the process rate variable type transversal filter 5 has a minimum value.

For example, the filter coefficient learning means 6 may be realized by one which has the construction as described for the first embodiment in FIG. 7.

The output signal from the FIR filter comprises both black circles "●" and white circles "○" in FIG. 5(c) when the signal is processed by employing the channel bit frequency, while comprises either black circles "●" or white circles "○" in FIG. 5(c) when the signal is processed by employing the frequency half as high as the channel bit frequency. Accordingly, with respect to an output signal which is subjected to partial response equalization by employing the frequency half as high as the channel bit frequency, intermediate data lacking at sampling is interpolated by a data interpolation means 7. The data interpolation means 7 may be realized by, for example, a filter having Nyquist characteristics that is described for the first embodiment in FIG. 8. In this case, filter coefficients as indicated by white circles "○" in FIG. 8 which are placed at intervals of twice as long cycle as a channel bit cycle are applied, whereby lacking data can be restored by Nyquist interpolation.

When a reproduction clock is generated by the process rate switching means 14 in FIG. 12 on the basis of the channel bit frequency, a phase error is detected from an output signal generated from the analog/digital converter 3 and the process rate variable type offset correction means 4, by the channel rate process phase error detection means 8. When a reproduction clock is generated by the process rate switching means 14 on the basis of the frequency half as high as the channel bit frequency, a phase error is detected by the half rate process phase error detection means 9. Either one of phase error signals detected by the channel rate process phase error detection means 8 and the half rate process phase error detection means 9 is selected by the phase error selection means 10 according to a process rate switching signal, and thereafter the selected phase error signal passes through the loop filter 11 for smoothing the phase error signal, and the clock generation means 12 is controlled so that phase of the reproduction clock is synchronized with phase of a clock component of the reproduction signal, on the basis of the output signal from the loop filter 11.

There is provided a phase locked loop means 13 which performs sampling of a reproduction waveform with the analog/digital converter 3 by employing the reproduction clock generated through the path that starts at the analog/digital converter 3 and ends at the clock generation means 12, whereby a multi-bit sampling signal which is synchronized with the phase of the clock component of the reproduction signal is generated. In this way, the PRML signal process is realized.

The phase locked loop means 13 may be realized as one which makes the phase of the clock component of the reproduction data synchronized with the phase of the reproduction clock on the basis of a principle as described for the first embodiment in FIGS. 9(a) and 9(b). The process rate switching signal which is supplied to the above-described respective blocks is generated by the process rate switching means 14.

Here, for example, the process rate switching means 14 may be realized as one which has an amplitude detection means 33 for detecting amplitude information from a reproduction signal waveform, judges by a defect judgement means 34 whether a defect exists or not from the amplitude information detected by the amplitude detection means 33, and generates by the process rate judgement means 15 the process rate switching signal on the basis of the defect judgement information as the result of judgement by the defect judgement means 34.

A defect occurs due to a deficiency on a recording medium such as an optical disk. The deficiency on a recording medium is a thing that blocks reflection of a laser beam, such as flaws existing on the recording surface, or fingerprints and things like dirt attached to the recording surface. Therefore, for example, the process rate switching means 14 may be realized as one which selects a channel rate process data demodulation means 13a when it is judged that a defect exists, and selects a half rate process data demodulation means 13b when it is judged that no defect exists.

For example, the amplitude detection means 33 may be realized as one which receives a reproduction signal as shown in FIG. 13(b) as an input signal, detects the top envelope by a peak hold means 35a for holding the peak level of the input signal and a low pass filter 36a for smoothing the output signal from the peak hold means 35a, as well as detects the bottom envelope by a peak hold means 35b for holding the peak level of the input signal and a low pass filter 36b for smoothing the output signal from the peak hold means 35b, and subtracts the detected bottom envelope from the top envelope by a subtraction means 37, whereby amplitude information as shown in FIG. 13(c) is obtained.

Further, for example, the defect judgement means 34 may be realized as one which generates a signal by which it is judged that a defect exists as shown in FIG. 13(d), when the amplitude information outputted from the amplitude detection means 33 is equal to or smaller than a prescribed threshold value "Vth" as shown in a dotted line in FIG. 13(c).

In some cases, the signal quality varies according to a kind of defect, like the reproduction signal shown in FIG. 13(b), in which an amplitude thereof is largely attenuated by flaws on the disk recording surface, and the amplitude is attenuated less by fingerprints or dirt. Therefore, it is also possible that according to a degree of deterioration in a reproduction signal amplitude, the defect judgement means 34 judges a defect at a level where reproduction performance can be secured as no defect, by properly setting the threshold value "Vth" shown in FIG. 13(c).

Figure 14:
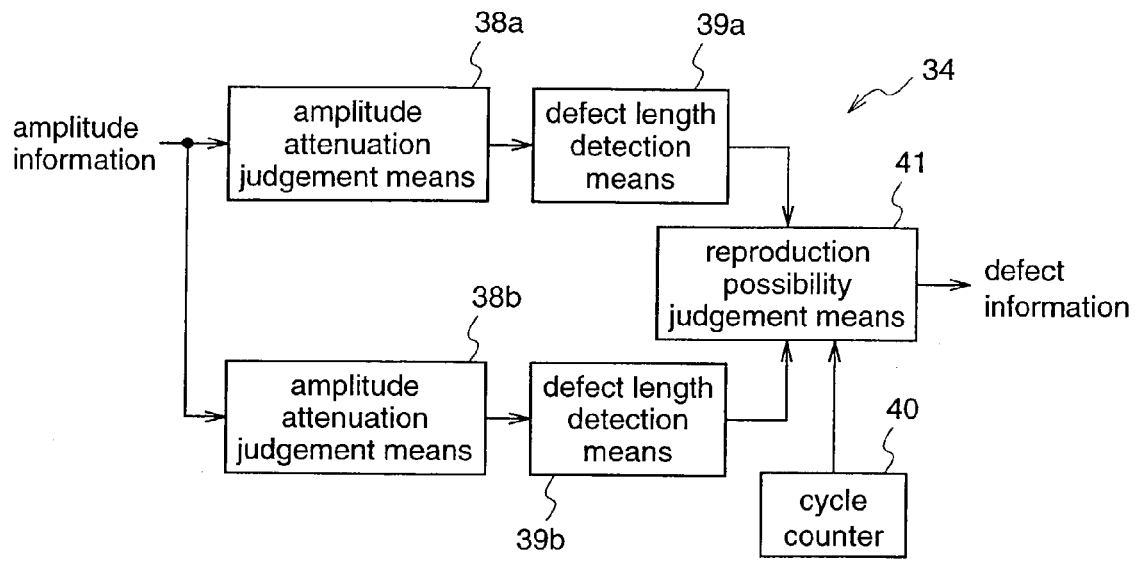
FIG. 14 is a block diagram illustrating the construction of a defect judgement means 34 according to the second embodiment.

Furthermore, for example, the defect judgement means 34 may be realized as one as shown in FIG. 14. This defect judgement means 34 comprises an amplitude attenuation judgement means 38a for detecting a defect causing large amplitude attenuation in a reproduction signal on the basis of the amplitude information outputted from the amplitude detection means 33 in FIG. 12, and an amplitude attenuation judgement means 38b for detecting a defect causing small amplitude attenuation in the reproduction signal; a defect length detection means 39a and a defect length detection means 39b for counting lengths of sections where it is judged that defects exist with respect to output results from the amplitude attenuation judgement means 38a and the amplitude attenuation judgement means 38b, respectively; and a reproduction possibility judgement means 41 for detecting reproduction possibility by weighting the output results from the defect length detection means 39a and the defect length detection means 39b in a prescribed section, according to respective degrees of reproduction difficulty, with a cycle counter 40 for measuring a predetermined time.

For example, the reproduction possibility judgement means 41 may be realized as one which judges that a defect exists in the section when it is judged that a reproduction process is difficult to be performed, and judges that no defect exists in the case of small flaws, fingerprints which cause almost no amplitude attenuation in the reproduction signal, or the like, that are judged to pose no problem in reproduction.

The partial response equalization signal outputted by a series of operations as described above is inputted to a half rate process maximum likelihood decoder 17 for performing decoding according to the type of partial response, whereby data demodulation is performed. Here, the half rate process maximum likelihood decoder 17 may be realized by, for example, a viterbi decoder for performing a demodulation process by employing the frequency half as high as the channel bit frequency, as described for the first embodiment.

Here, a channel rate process data demodulation means 13*a* may be realized so that the process rate switching means 14 generates a process rate switching signal to perform a data demodulation process by mainly employing the channel bit frequency, and in the phase locked loop means 13, the channel rate process offset detection means 18 in the process rate variable type offset correction means 4, and the channel rate process phase error detection means 8 are selected, and the process rate variable type transversal filter 5 operates on the basis of the channel bit frequency, and an output signal therefrom passes through the data interpolation means 7 and is subjected to digital data demodulation by the half rate process maximum likelihood decoder 17.

Further, a half rate process data demodulation means 13*b* may be realized so that the process rate switching means 14 generates a process rate switching signal to perform a data demodulation process by employing the frequency half as high as the channel bit frequency, and in the phase locked loop means 13, the half rate process offset detection means 19 in the process rate variable type offset correction means 4, as well as the half rate process phase error detection means 9 are selected, and the process rate variable type transversal filter 5 operates on the basis of the frequency half as high as the channel bit frequency, and an output signal therefrom passes through the data interpolation means 7 and is subjected to digital data demodulation by the half rate process maximum likelihood decoder 17.

By a series of measures as described above, which make full use of the characteristics of the 8–16 modulation code or the like to switch a process rate for the PRML signal process by the process rate switching means 14 according to whether a defect exists or not, phase synchronization between demodulation data and a reproduction clock is maintained in a favorable state or restored in the case of a defect generated by flaws, fingerprints or the like on the disk recording surface, which is supposed to make it difficult to demodulate data, whereby a reading performance can be maintained in a favorable state. Further, defect information which influences reproduction performance can be accurately detected by the amplitude detection means 33 and the defect judgement means 34, whereby switching to a data demodulation process employing the channel bit frequency is not performed more than required, resulting in a reduction in power consumption and a system with stable operation.

Figure 15:
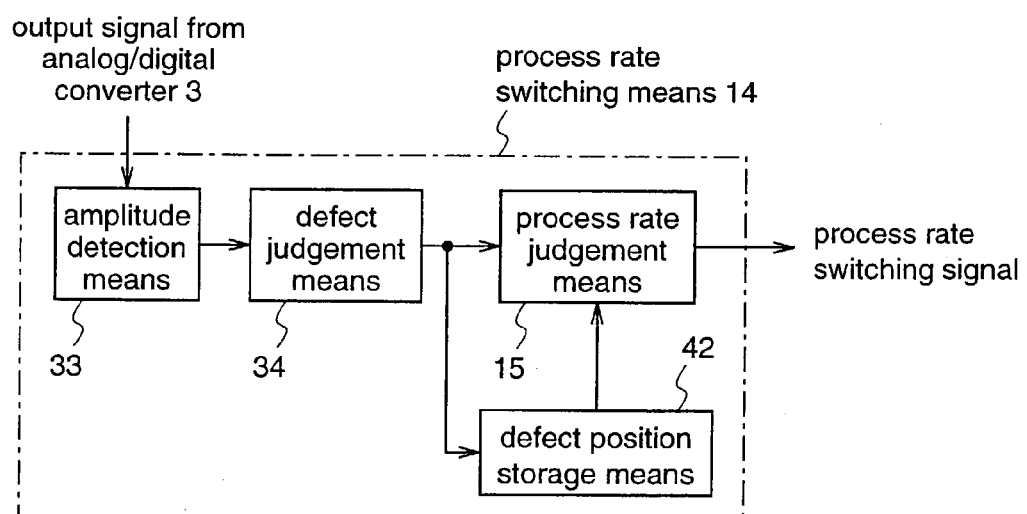
FIG. 15 is a block diagram illustrating the construction of a process rate switching means 14 according to the second embodiment.

The process rate switching means 14 according to the second embodiment may be realized as shown in FIG. 15. For example, this process rate switching means 14 has the amplitude detection means 33 for detecting amplitude information from a reproduction signal waveform, judges by the defect judgement means 34 whether a defect exists or not, from the detected amplitude information, and generates a process rate switching signal by the process rate judgement means 15 on the basis of defect information obtained as the result of judgement by the defect judgement means 34, and further has a defect position storage means 42 for storing a position where the defect judgement means 34 judges that a defect exists, and, when data demodulation is performed again for a position where reproduction has been performed once, refers to defect information stored in the defect position storage means 42, to generates a process rate switching signal so that, in advance, a data demodulation process can be performed by mainly employing the channel bit frequency for a part where a defect exists.

Figure 16:
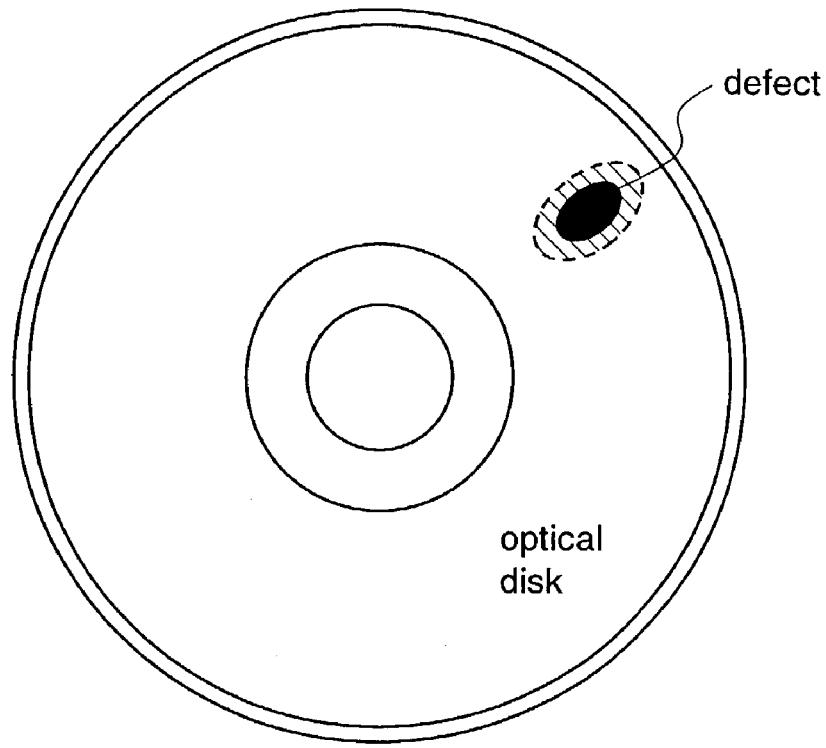
FIGS. 16(*a*) and 16(*b*) are explanatory diagrams of a position of switching by a process rate switching means 14 according to the second embodiment.
Figure 16:
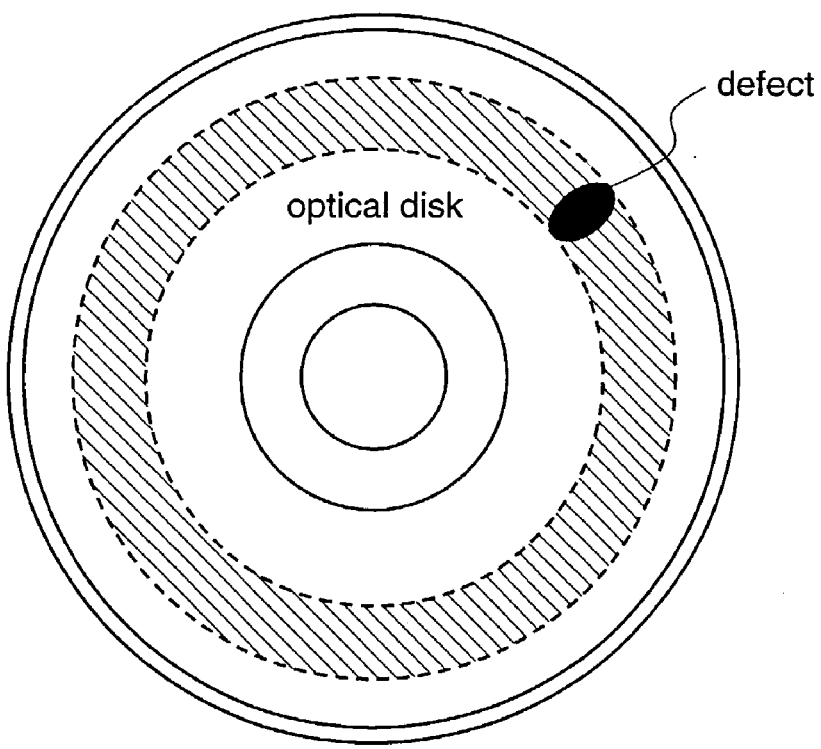

Further, when digital data is demodulated from an optical disk on which tracks where the digital data is recorded are spirally formed at predetermined intervals in the circumference direction, for example, the defect position storage means 42 may judge that a defect exists at a position where the defect actually exists as well as in an area surrounding that position with a prescribed distance therefrom, as shown by a dotted line in FIG. 16(*a*). Furthermore, for example, the defect position storage means 42 may judge that a defect exists at a position where the defect actually exists as well as in the whole recording track where the defect exists, as shown in a dotted line in FIG. 16(*b*).

The process rate switching means 14 as described above can switch to a data demodulation process rate in advance for a part where a defect exists, whereby the accuracy of data demodulation at second or subsequent times is increased and a reading performance is stabilized. Since a recording track where a defect exists is a target of process rate switching, particularly when a seeking process in which a reproduction part is changed at random is performed, there is no need to switch a processing means between a normal area and an area where a defect exists and, thus, the frequency of occurrence of process rate switching control is decreased, resulting in an increase in system stability.

Figure 17:
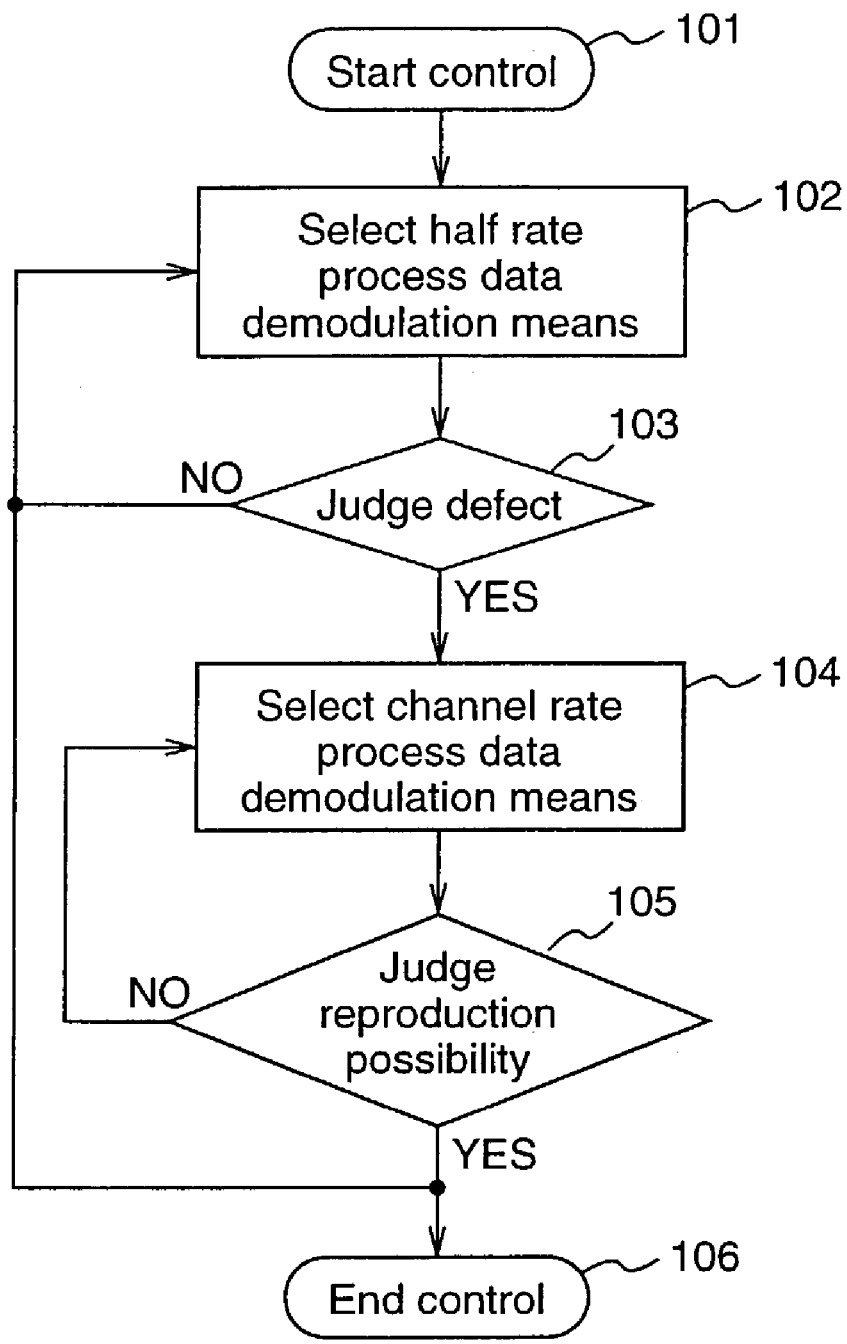
FIG. 17 is a flowchart illustrating a method for controlling a process rate switching means 14 according to the second embodiment.

For example, the process rate switching means 14 as described for the second embodiment may be controlled according to the flow as shown in a flowchart in FIG. 17.

Initially, at control start (process 101), the half rate process data demodulation means 13*b* for performing a data demodulation process by employing the frequency half as high as the channel bit frequency is selected (process 102). Next, the defect judgement means 34 judges the presence or absence of a defect (process 103), and the process by the half rate process data demodulation means continues when the defect judgement means 34 judges that there is no defect, while the half rate process data demodulation means is switched to the channel rata process data demodulation means that mainly employs the channel bit frequency to perform a data demodulation process, when the defect judgement means 3 judges that a defect exists (process 104). Thereafter, the reproduction possibility judgement means 41 judges whether reproduction is possible in a prescribed section set by the cycle counter 40 or not (process 105). According to this judgement, a period where a defect is detected is monitored, and when defect is changed to a shorter defect to have a length equal to or smaller than a prescribed value, the channel rate process is canceled, and the process shifts to a half rate mode. Therefore, a process rate switching signal is controlled so that the demodulation operation by the channel rate process data demodulation means 13*a* is continued until it is judged that reproduction is possible, and the demodulation operation by the half rate process data demodulation means is resumed after it is judged that reproduction is possible (process 102), and this process is repeated until control end (process 106).

Thereby, a data demodulation process rate is not frequently changed, and thus it is possible to realize a stable system which gives priority over the quality of the demodulation data relating to reproduction when a defect exists.

As described above, according to the second embodiment, a function of switching between a channel rate process and a half rate process by a sampling rate variable process is provided, and the half rate process is usually selected in favor of reduced power consumption, and the half rate process is switched to the channel rate process when it is judged that there are flaws or dirt on the optical disk, on the basis of defect information, whereby reproduction is performed. Therefore, a stable reading operation can be performed while power consumption is suppressed.

Further, in cases where the half rate process is switched to the channel rate process to perform reproduction, since there is a possibility that defects also exist on the periphery of a part where it is judged that a defect exists, the channel rate mode also covers a predetermined range on the periphery of the part where a defect is detected. Thereby, a stable reading operation can be surely performed while power consumption is suppressed.

Furthermore, in cases where the half rate process is switched to the channel rate process to perform reproduction, a period where a defect is detected is monitored, and when a state changes from a long defect to a shorter defect to have a length equal to or smaller than a prescribed value, the channel rate process is canceled, and the process shifts to the half rate mode. Thereby, power consumption is further suppressed while a reading operation is stablized.

Embodiment 3

An optical disk reproducing device according to a third embodiment performs switching of a data demodulation process rate on the basis of a result of judgement of a tilt angle relating to an optical recording medium.

Hereinafter, the optical disk reproducing device according to the third embodiment will be described with reference to FIGS. 2 to 9(*b*) and 18 and 19.

Figure 18:
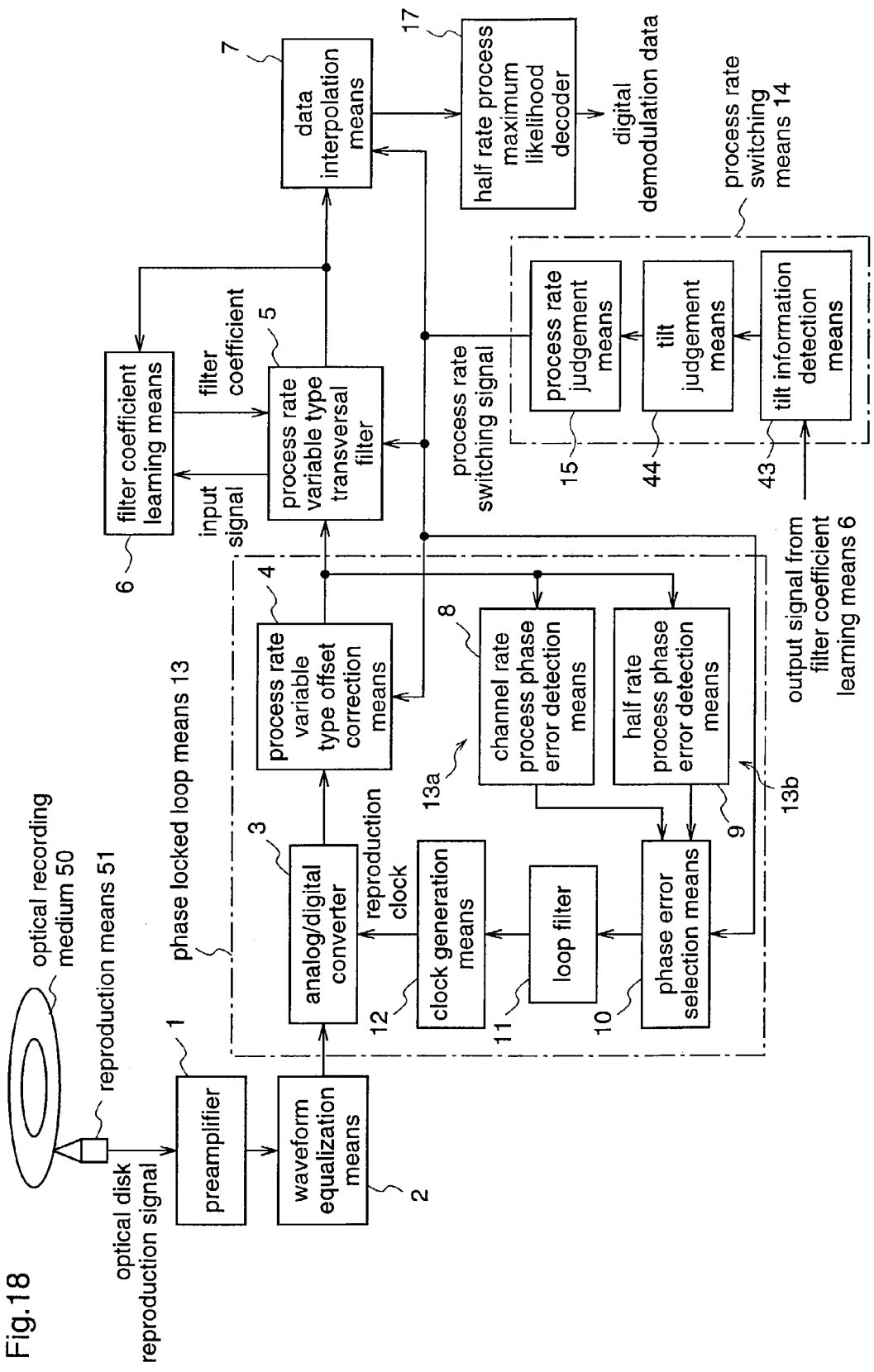
FIG. 18 is a block diagram illustrating the construction of a process rate variable type optical disk reproducing device according to a third embodiment of the present invention.

In FIG. 18, an output amplitude of an optical disk reproduction signal which is reproduced from an optical recording medium 50 by a reproduction means 51 is emphasized by a preamplifier 1, and thereafter the optical disk reproduction signal is corrected by a waveform equalization means 2 so that a high frequency band thereof is emphasized. The waveform equalization means 2 comprises a filter which enables a boost amount and a cutoff frequency to be set arbitrarily. This waveform equalization means 2 may be realized by, for example, a high-order ripple filter or the like, which has frequency characteristics as shown as a solid line in FIG. 2.

Next, an output signal from the waveform equalization means 2 is sampled into a multi-bit digital signal by an analog/digital converter 3 which is a means for converting an analog signal into a digital signal. The analog/digital converter 3 performs sampling by employing a reproduction clock which is generated by a clock generation means 12. At this time, in cases where a code of digital data to be demodulated is one in which the minimum run-length is limited to "2", like, for example, an 8–16 modulation code employed for a DVD, and MTF characteristics as optical reproduction characteristics are distributed in a band which is almost a quarter or less of a channel bit frequency as shown in FIG. 3, digital data can be demodulated theoretically according to a sampling theorem, even when sampling is performed by the analog/digital converter 3 by employing a reproduction clock which has a frequency component half as high as the channel bit frequency.

By utilizing this, the present invention enables the selection between a case where a reproduction clock is generated on the basis of the same frequency as the channel bit frequency, and a case where a reproduction clock is generated on the basis of frequency which is half as high as the channel bit frequency. This sampled multi-bit digital signal is inputted to a process rate variable type offset correction means 4, thereby correcting an offset component included in the reproduction digital signal.

For example, the process rate variable type offset correction means 4 may be realized by one which has the construction as described for the first embodiment in FIG. 4.

Figure 5:
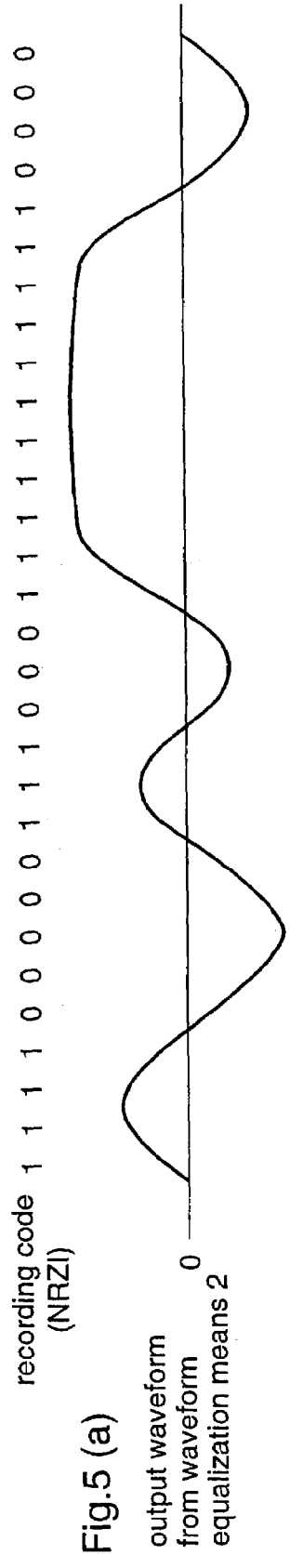
FIGS. 5(a)–5(c) are explanatory diagrams of a difference between a PR (a, b, b, a) equalization system, which is realized by a process rate variable transversal filter 5 according to the first embodiment, and a typical binarization judgement system.
Figure 5:
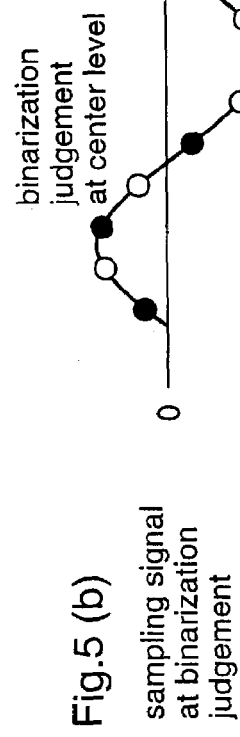
Figure 5:
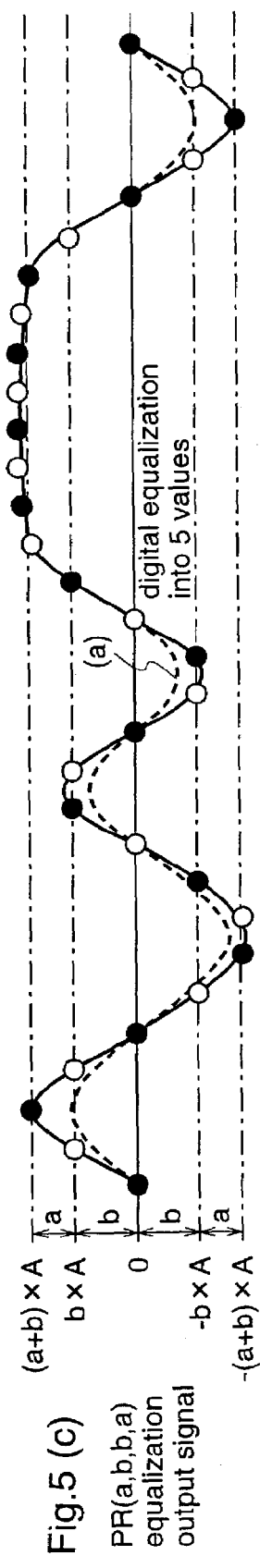

Next, an output signal from the process rate variable type offset correction means 4 is inputted to a process rate variable type transversal filter 5 to be subjected to partial response equalization. Here, partial response equalization employs a PR (a, b, b, a) system in which, for example, a reproduction signal of a DVD has its waveform amplitude after equalization divided into five values as shown in FIG. 5(*c*). Black circles "●" and white circles "○" in FIGS. 5(*b*) and 5(*c*) indicate data sampled by a reproduction clock. When sampling is performed by employing a clock which is generated on the basis of the channel bit frequency, the signal comprises both sampled data "●" and "○". On the other hand, when sampling is performed by employing a clock which is generated on the basis of the frequency half as high as the channel bit frequency, the signal comprises either one sampled data "●" or "○".

Conventionally, in a lead channel employed for optical disk reproduction, a waveform-equalized output signal as shown in FIG. 5(*a*) is subjected to binarization judgement with the center level thereof as a slice level, whereby digital data demodulation is performed. Further, sampling is performed at prescribed sections as shown in FIG. 5(*b*), and a sampled multi-bit digital signal is subjected to binarization judgement with the center level thereof as a slice level.

On the other hand, according to the PR (a, b, b, a) system, a signal in which sampling data of four different times are added at a rate a:b:b:a (a+b*D+b*D2+a*D4) is generated, and characteristics corresponding to a low-pass filter as shown in FIG. 3 are added to a reproduction signal.

It is thought that a partial response system that has frequency characteristics nearer to the MTF characteristics shown in FIG. 3 is a more favorable system. In addition to the systems shown in FIG. 3 including the PR (a, b, b, a) system, there exist various types of partial response systems. It is not restricted to a filter of specific system, and filters of other types may be also employed as long as they achieve desired equalization performance. A partial response system which adds correlation in the direction of time of reproduction data, and a viterbi decoder, as one of after-mentioned maximum likelihood decoding methods, which estimates the most likely series by utilizing the added data correlation are used together, whereby the PRML signal process which is supposed to be advantageous in high-density recording/reproduction in the linear recording direction is realized.

As described above, since various PRML signal process systems exist according to characteristics of reproduction waveform or modulation code, an appropriate system should be selected for a recording/reproduction system of each kind. A process rate variable type transversal filter 5 may be realized by, for example, an FIR filter which comprises finite taps. Equalization characteristics obtained by the FIR filter is achieved by varying a filter coefficient.

For example, the FIR filter may be realized as one as described for the first embodiment in FIG. 6.

The filter coefficients S1 to S7 of the FIR filter are set by a filter coefficient learning means 6 that utilizes an LMS algorithm for adaptively performing control so that an equalization error existing in a partial response equalization output signal outputted from the process rate variable type transversal filter 5 has a minimum value.

For example, the filter coefficient learning means 6 may be realized as one which has the construction as described for the first embodiment in FIG. 7.

The output signal from the FIR filter comprises both black circles "●" and white circles "○" in FIG. 5(c) when the signal is processed by employing the same frequency as the channel bit frequency, and comprises either black circles "●" or white circles "○" in FIG. 5(c) when the signal is processed by employing the frequency half as high as the channel bit frequency. Accordingly, with respect to an output signal which is subjected to partial response equalization by employing the frequency half as high as the channel bit frequency, intermediate data lacking at sampling is interpolated by a data interpolation means 7. The data interpolation means 7 may be realized by, for example, a filter having Nyquist characteristics that is described for the first embodiment as shown in FIG. 8. In this case, filter coefficients as indicated by white circles "○" in FIG. 8 which are placed at intervals of twice as long cycle as a channel bit cycle are applied, whereby lacking data can be restored by Nyquist interpolation.

When a reproduction clock is generated by the process rate switching means 14 in FIG. 18 on the basis of the channel bit frequency, a phase error is detected from an output signal generated from the analog/digital converter 3 and the process rate variable type offset correction means 4, by the channel rate process phase error detection means 8. When a reproduction clock is generated by the process rate switching means 14 on the basis of the frequency half as high as the channel bit frequency, a phase error is detected by the half rate process phase error detection means 9.

Either one of phase error signals detected by the channel rate process phase error detection means 8 and the half rate process phase error detection means 9 is selected by the phase error selection means 10 according to a process rate switching signal, and thereafter the selected phase error signal passes through the loop filter 11 for smoothing the phase error signal, and the clock generation means 12 is controlled so that the phase of the reproduction clock is synchronized with the phase of a clock component of the reproduction signal, on the basis of the output signal from the loop filter 11.

There is provided a phase locked loop means 13 which performs sampling of a reproduction waveform with the analog/digital converter 3 by employing the reproduction clock generated through the path that starts at the analog/digital converter 3 and ends at the clock generation means 12, whereby a multi-bit sampling signal which is synchronized with the phase of the clock component of the reproduction signal is generated. In this way, the PRML signal process is realized.

The phase locked loop means 13 may be realized as one which makes the phase of the clock component of the reproduction data synchronized with the phase of the reproduction clock on the basis of a principle as described for the first embodiment in FIGS. 9(a) and 9(b).

The process rate switching signal which is supplied to the above-described respective blocks is generated by the process rate switching means 14. Here, for example, the process rate switching means 14 may be realized as one which has a tilt information detection means 43 for detecting tilt information indicating a degree of influence of a tilt angle between a perpendicular to the recording surface of an optical disk and an optical axis of a laser beam, exerted on the quality of the reproduction signal according to the magnitude of the tilt angle, with each filter coefficient value which is learned when adaptive control is performed by a filter coefficient learning means 6, so that a square mean value of an equalization error of an equalization output signal from the process rate variable type transversal filter 5 has a minimum value, being an input signal; judges by a tilt judgement means 44 whether quality deterioration in reproduction signal due to tilt is large or small, on the basis of a degree of deviation in the filter coefficient at a side tap of the process rate variable type transversal filter 5, which is detected by the tilt information detection means 43; and generates a process rate switching signal by a process rate judgement means 15 on the basis of tilt judgement information as the result of judgement by the tilt judgement means 44.

For example, the process rate switching means 14 may be realized as one which selects a channel rate process data demodulation means 13a when the tilt judgement means 44 judges that quality deterioration in reproduction signal caused by tilt is large, and selects a half rate process data demodulation means 13b when the tilt judgement means 44 judges that quality deterioration in reproduction signal caused by tilt is small.

The partial response equalization signal outputted by a series of operations as described above is inputted to a half rate process maximum likelihood decoder 17 for performing decoding according to the type of partial response, whereby data demodulation is performed. Here, the half rate process maximum likelihood decoder 17 may be realized by, for example, a viterbi decoder for performing a demodulation process by employing the frequency half as high as the channel bit frequency, as described for the first embodiment.

Here, a channel rate process data demodulation means 13a may be realized so that the process rate switching means 14 generates a process rate switching signal to perform a data demodulation process by mainly employing the channel bit frequency, and in the phase locked loop means 13, the channel rate process offset detection means 18 in the process rate variable type offset correction means 4, and the channel rate process phase error detection means 8 are selected, and the process rate variable type transversal filter 5 operates on the basis of the channel bit frequency, and an output signal therefrom passes through the data interpolation means 7 and is subjected to digital data demodulation by the half rate process maximum likelihood decoder 17.

Further, a half rate process data demodulation means 13b may be realized so that the process rate switching means 14 generates a process rate switching signal to perform a data demodulation process by employing the frequency half as high as the channel bit frequency, and in the phase locked loop means 13, the half rate process offset detection means 19 in the process rate variable type offset correction means 4, as well as the half rate process phase error detection means 9 are selected, and the process rate variable type transversal filter 5 operates on the basis of the frequency half as high as the channel bit frequency, and an output signal therefrom passes through the data interpolation means 7 and is subjected to digital data demodulation by the half rate process maximum likelihood decoder 17.

By a series of measures as described above, which make full use of the characteristics of the 8–16 modulation code or the like to switch a process rate for the PRML signal process by the process rate switching means 14 according to quality deterioration in reproduction signal which is caused by tilt, the quality of the demodulation data is maintained in a favorable state even when the quality of a reproduction signal is deteriorated dependently on a tilt.

Figure 19:
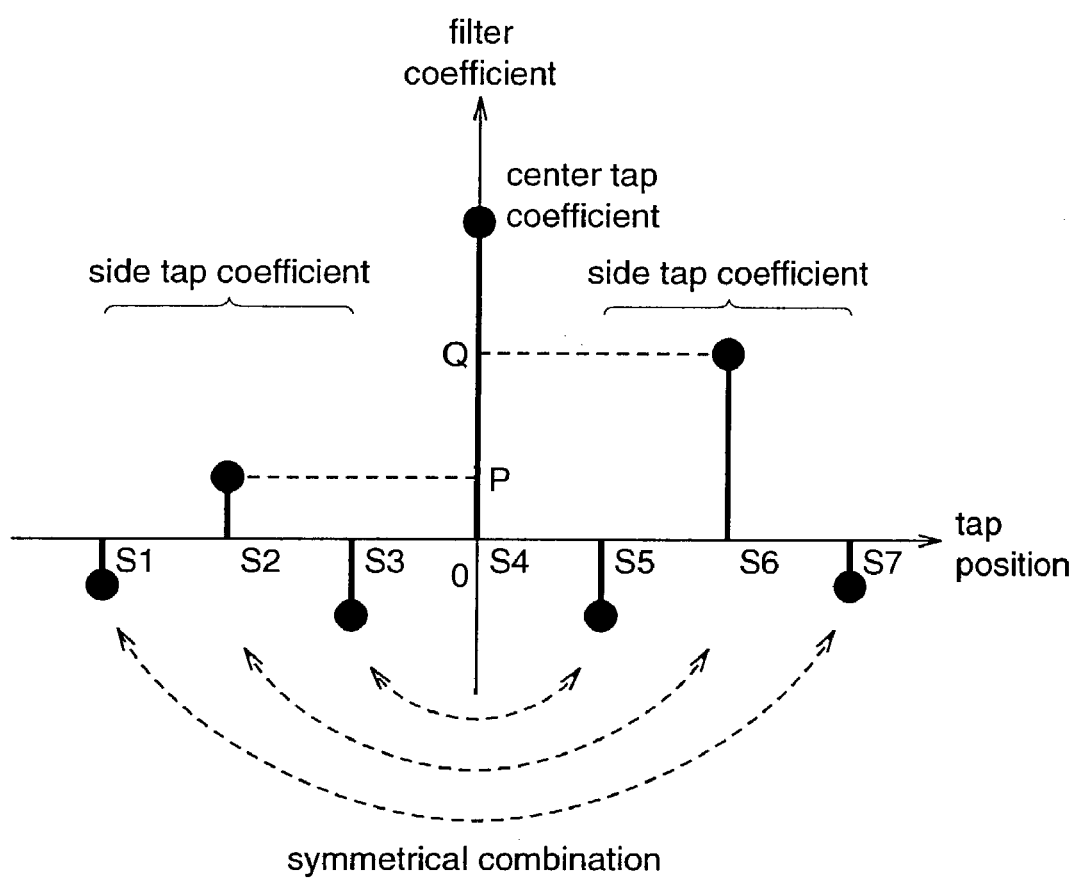
FIG. 19 is an explanatory diagram of a principle of operation of a tilt information detection means 43 and a tilt judgement means 44 according to the third embodiment.

For example, the tilt information detection means 43 and the tilt judgement means 44 described for the third embodiment may judge quality deterioration in the reproduction signal which is caused by tilt, according to a principle as shown in FIG. 19.

FIG. 19 illustrates a filter coefficient after adaptive equalization learning at each tap of the process rate variable type transversal filter 5, which is outputted from the filter coefficient learning means 6.

Here, among filter coefficients from S1 to S7 shown in FIG. 6, absolute values of filter coefficients are compared between S1 and S7, S2 and S6, and S3 and S5, which respectively exist at symmetric positions with respect to S4 as a filter coefficient of the center tap, and when a condition that ratios therebetween differ by more than a predetermined value is met, the tilt judgement means 44 judges that quality deterioration in reproduction signal which is caused by tilt is large. For example, in FIG. 19, when S2 is a filter coefficient "P" and S6 is a filter coefficient "Q", a ratio between an absolute value of "P" and that of "Q" is more than twofold, and thus it is apparent that a phase relationship in a reproduction signal band is abnormal. Therefore, the tilt judgement means 44 judges that quality deterioration in reproduction signal is large.

By employing the process rate switching means 14 as described above, a data demodulation process rate can be controlled according to a degree of quality deterioration in the reproduction signal caused by a tilt and, thus, a data demodulation process employing the channel bit frequency is performed only in case of necessity, whereby power consumption is reduced and a stable system can be realized.

As described above, according to the third embodiment, a function of switching between a channel rate process and a half rate process by a sampling rate variable process is provided, and the channel rate process is selected when it is judged that a tilt angle is large, and the half rate process is performed when it is judged that a tilt angle is small, whereby reproduction is performed without reducing a reading performance even when a reproduction waveform is deteriorated by tilt, while power consumption is suppressed.

Further, a coefficient of a transversal filter (FIR filter) is learned by a LMS (Least Mean Square method), and it is judged that a tilt angle is large when a deviation in the coefficient of a side tap is large, while it is judged that a tilt angle is small when a deviation in coefficient of a side tap is small, whereby the magnitude of the tilt angle can be judged by employing a reproduction signal of an optical disk itself, and thus an increase in scale of a circuit that is required for the judgement of a tilt angle can be suppressed.

Embodiment 4

An optical disk reproducing device according to a fourth embodiment performs switching of a data demodulation process rate according to the volume of jitter amount of a reproduction signal of an optical recording medium.

Hereinafter, the optical disk reproducing device according to the fourth embodiment will be described with reference to FIGS. 2 to 9(b) and 20 and 21.

Figure 20:
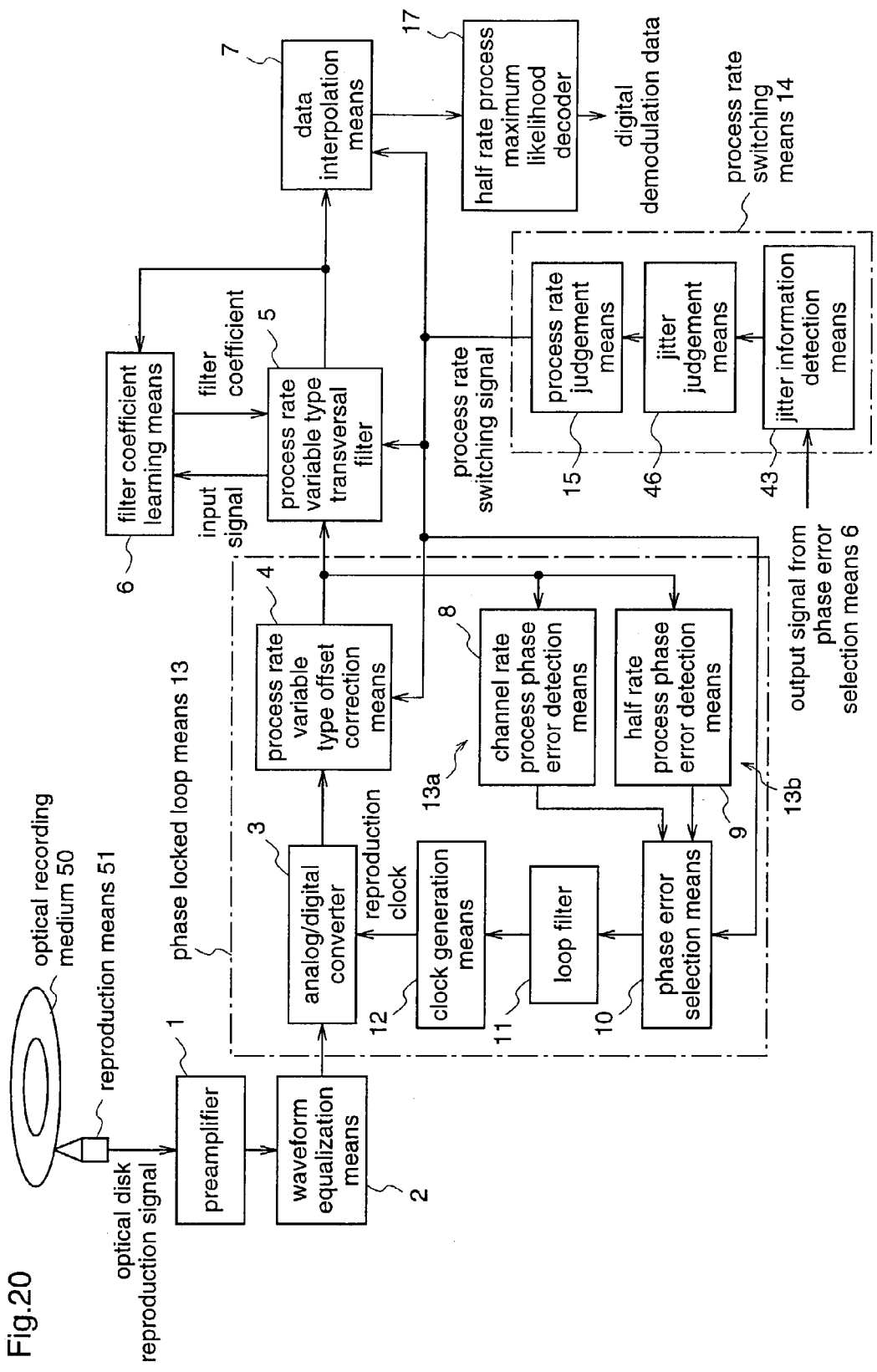
FIG. 20 is a block diagram illustrating the construction of a process rate variable type optical disk reproducing device according to a fourth embodiment.

In FIG. 20, an output amplitude of an optical disk reproduction signal which is reproduced from an optical recording medium 50 by a reproduction means 51 is emphasized by a preamplifier 1, and thereafter the optical disk reproduction signal is corrected by a waveform equalization means 2 so that a high frequency band thereof is emphasized. The waveform equalization means 2 comprises a filter which enables a boost amount and a cutoff frequency to be set arbitrarily. This waveform equalization means 2 may be realized by, for example, a high-order ripple filter or the like, which has frequency characteristics as shown as a solid line in FIG. 2.

Next, an output signal from the waveform equalization means 2 is sampled into a multi-bit digital signal by an analog/digital converter 3 which is a means for converting an analog signal into a digital signal. The analog/digital converter 3 performs sampling by employing a reproduction clock which is generated by a clock generation means 12. At this time, in cases where a code of digital data to be demodulated is one in which the minimum run-length is limited to "2", like, for example, an 8–16 modulation code employed for a DVD, and MTF characteristics as optical reproduction characteristics are distributed in a band which is almost a quarter or less of a channel bit frequency as shown in FIG. 3, digital data can be demodulated theoretically according to a sampling theorem, even when sampling is performed by the analog/digital converter 3 by employing a reproduction clock which has a frequency component half as high as the channel bit frequency.

By utilizing this, the present invention enables the selection between a case where a reproduction clock is generated on the basis of the same frequency as the channel bit frequency, and a case where a reproduction clock is generated on the basis of frequency which is half as high as the channel bit frequency. This sampled multi-bit digital signal is inputted to a process rate variable type offset correction means 4, thereby correcting an offset component included in the reproduction digital signal.

For example, the process rate variable type offset correction means 4 may be realized as one which has the construction as described for the first embodiment in FIG. 4.

Next, an output signal from the process rate variable type offset correction means 4 is inputted to a process rate variable type transversal filter 5 to be subjected to partial response equalization. Here, partial response equalization employs a PR (a, b, b, a) system in which, for example, a reproduction signal of a DVD has its waveform amplitude after equalization divided into five values as shown in FIG. 5(c). Black circles "●" and white circles "○" in FIGS. 5(b) and (c) indicate data sampled by a reproduction clock. When sampling is performed by employing a clock which is generated on the basis of the channel bit frequency, the signal comprises both sampled data "●" and "○". On the other hand, when sampling is performed by employing a clock which is generated on the basis of the frequency half as high as the channel bit frequency, the signal comprises either one sampled data "●" or "○".

Conventionally, in a lead channel employed for optical disk reproduction, a waveform-equalized output signal as shown in FIG. 5(a) is subjected to binarization judgement with the center level thereof as a slice level, whereby digital demodulation data is performed. Further, sampling is performed at prescribed sections as shown in FIG. 5(b), and a sampled multi-bit digital signal is subjected to binarization judgement with the center level thereof as a slice level.

On the other hand, according to the PR (a, b, b, a) system, a signal in which sampling data of four different times are added at a rate a:b:b:a (a+b*D+b*D2+a*D4) is generated, and characteristics corresponding to a low-pass filter as shown in FIG. 3 are added to a reproduction signal.

It is thought that a partial response system that has frequency characteristics nearer to the MTF characteristics shown in FIG. 3 is a more favorable system. In addition to the systems shown in FIG. 3 including the PR (a, b, b, a) system, there exist various types of partial response systems. It is not restricted to a filter of specific system, and filters of other types may be also employed as long as they achieve desired equalization performance. A partial response system which adds correlation in the direction of time of reproduction data, and a viterbi decoder, as one of after-mentioned maximum likelihood decoding methods, which estimates the most likely series by utilizing the added data correlation are used together, whereby the PRML signal process which is supposed to be advantageous in high-density recording/reproduction in the linear recording direction is realized.

As described above, since various PRML signal process systems exist according to characteristics of reproduction waveform or modulation code, an appropriate system should be selected for a recording/reproduction system of each kind. A process rate variable type transversal filter 5 may be realized by, for example, an FIR filter which comprises finite taps. Equalization characteristics obtained by the FIR filter are achieved by varying a filter coefficient.

For example, the FIR filter may be realized as one as described for the first embodiment in FIG. 6.

The filter coefficients S1 to S7 of the FIR filter are set by a filter coefficient learning means 6 that utilizes an LMS algorithm for adaptively performing control so that an equalization error existing in a partial response equalization output signal outputted from the process rate variable type transversal filter 5 has a minimum value.

For example, the filter coefficient learning means 6 may be realized as one which has the construction as described for the first embodiment in FIG. 7. The output signal from the FIR filter comprises both black circles "●" and white circles "○" in FIG. 5(*c*) when the signal is processed by employing the channel bit frequency, and comprises either black circles "●" or white circles "○" in FIG. 5(*c*) when the signal is processed by employing the frequency half as high as the channel bit frequency. Accordingly, with respect to an output signal which is subjected to partial response equalization by employing the frequency half as high as the channel bit frequency, intermediate data lacking at sampling is interpolated by a data interpolation means 7. The data interpolation means 7 may be realized as, for example, a filter having Nyquist characteristics that is described for the first embodiment in FIG. 8. In this case, filter coefficients as indicated by white circles "○" in FIG. 8 which are placed at intervals of twice as long cycle as a channel bit cycle are applied, whereby lacking data can be restored by Nyquist interpolation.

When a reproduction clock is generated by the process rate switching means 14 on the basis of the channel bit frequency, a phase error is detected from an output signal generated from the analog/digital converter 3 and the process rate variable type offset correction means 4, by the channel rate process phase error detection means 8. When a reproduction clock is generated by the process rate switching means 14 on the basis of the frequency half as high as the channel bit frequency, a phase error is detected by the half rate process phase error detection means 9.

Either one of phase error signals detected by the channel rate process phase error detection means 8 and the half rate process phase error detection means 9 is selected by the phase error selection means 10 according to a process rate switching signal, and thereafter, the selected phase error signal passes through the loop filter 11 for smoothing the phase error signal, and the clock generation means 12 is controlled so that the phase of the reproduction clock is synchronized with the phase of a clock component of the reproduction signal, on the basis of the output signal from the loop filter 11.

There is provided a phase locked loop means 13 which performs sampling of a reproduction waveform with the analog/digital converter 3 by employing the reproduction clock generated through the path that starts at the analog/digital converter 3 and ends at the clock generation means 12, whereby a multi-bit sampling signal which is synchronized with the phase of the clock component of the reproduction signal is generated. In this way, the PRML signal process is realized.

Figure 9:
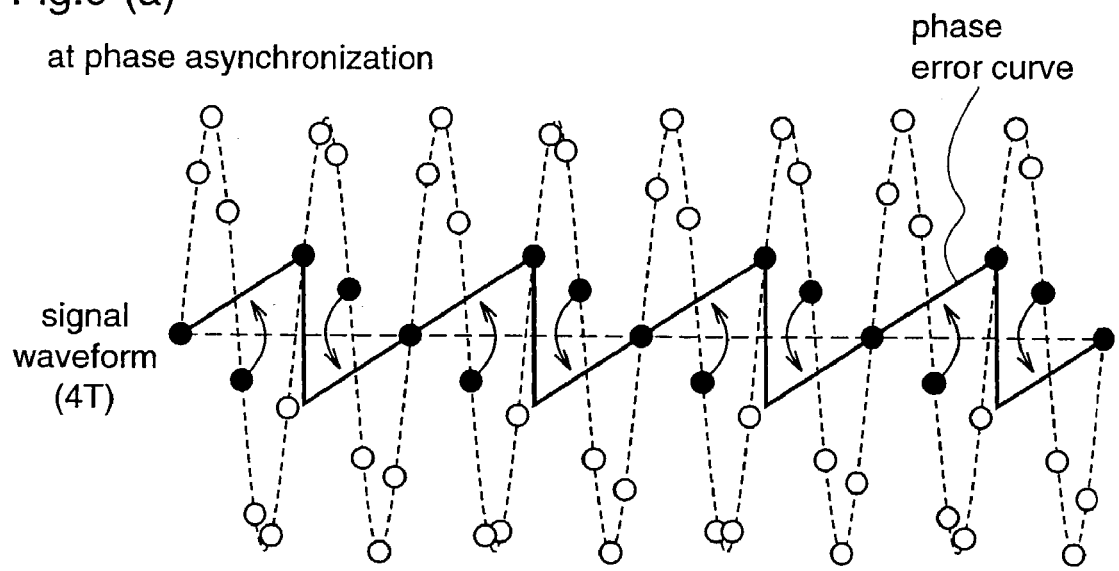
FIGS. 9(a) and 9(b) are explanatory diagrams of a principle of operation of a channel rate process phase error detection means 8 according to the first embodiment.
Figure 9:
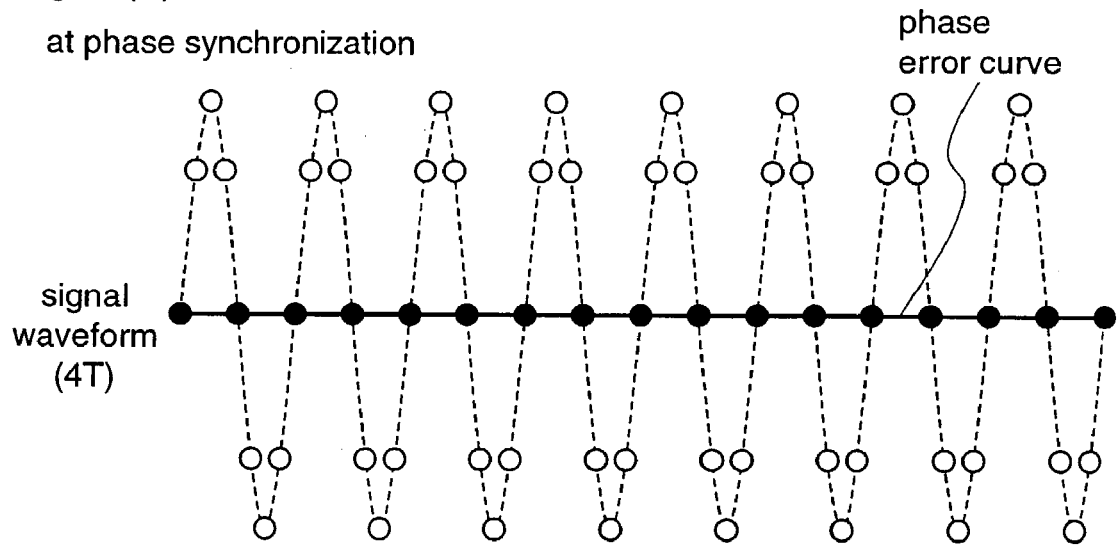
Figure 10:
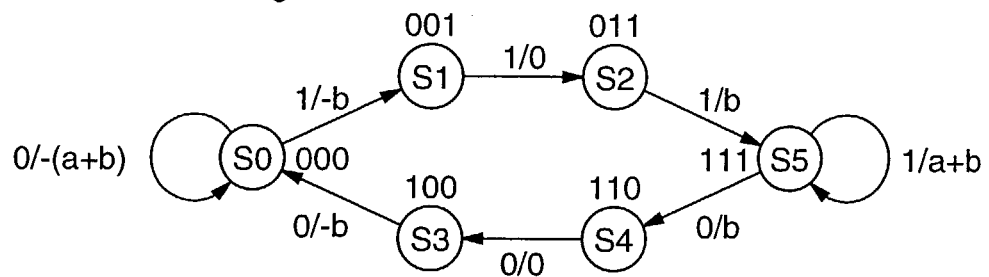
FIGS. 10(a) and (10 b) are explanatory diagrams of a principle of operation when a half rate process maximum likelihood decoder 17 according to the first embodiment is realized by a viterbi decoder.
FIG. 10(b) is a diagram illustrating a trellis diagram and remaining paths.
Figure 10:
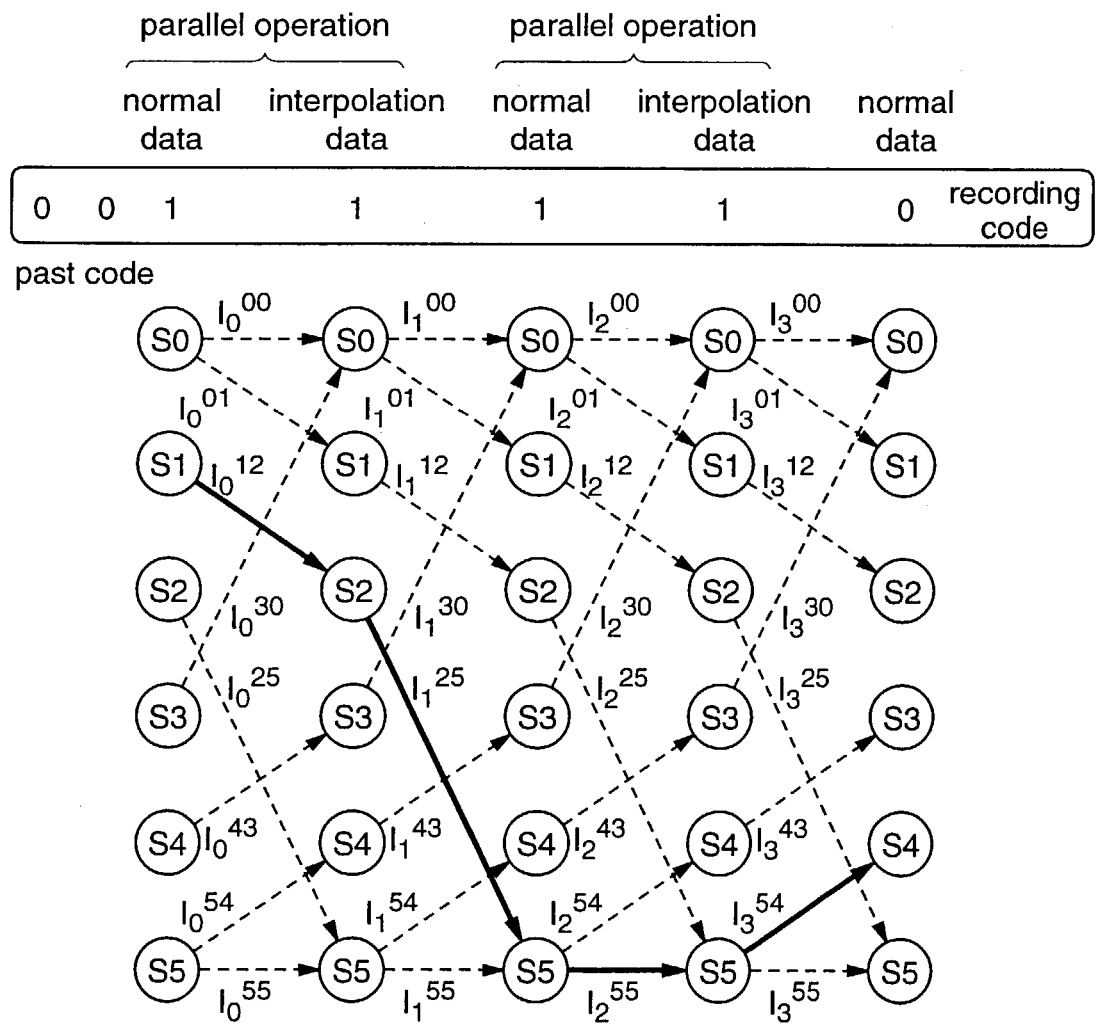
Figure 11:
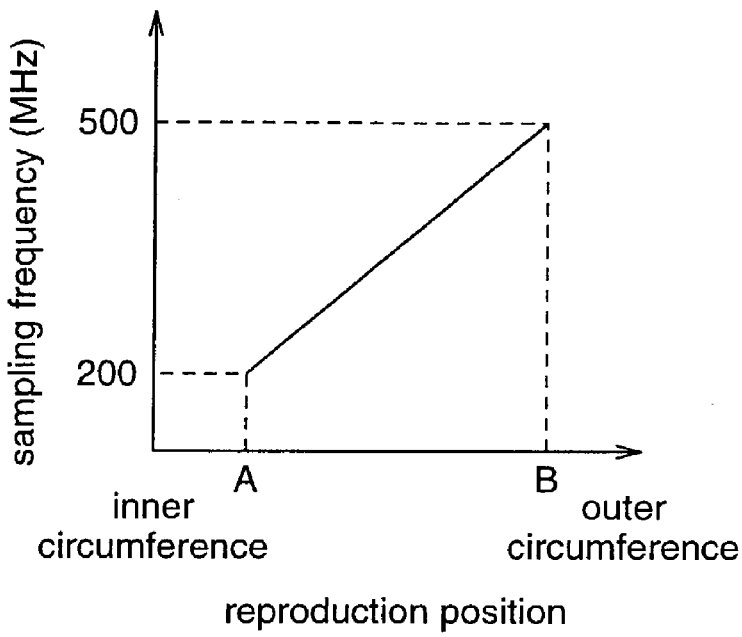
FIGS. 11(a) and 11(b) are explanatory diagrams of an operation, at CAV reproduction, of a process rate switching means 14 according to the first embodiment.
Figure 11:
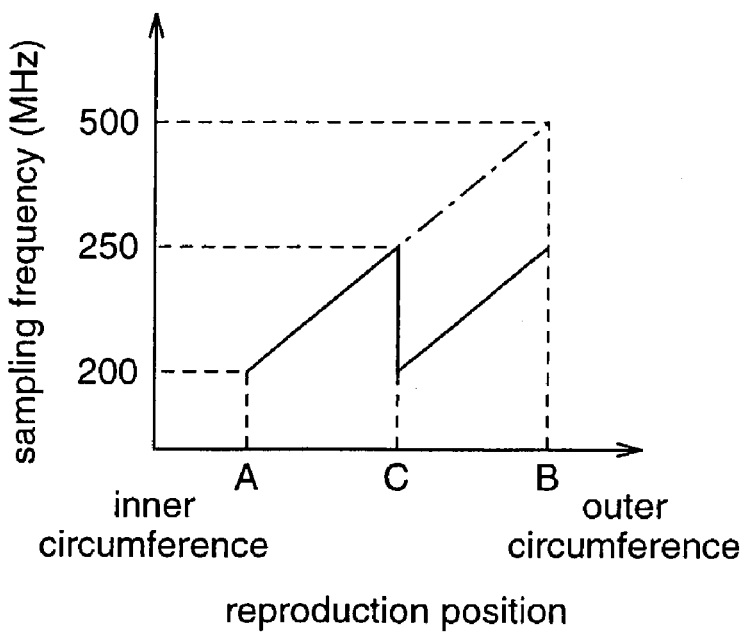

The phase locked loop means 13 may be realized as one which makes the phase of the clock component of the reproduction data synchronized with the phase of the reproduction clock on the basis of a principle as described for the first embodiment in FIGS. 9(*a*) and (*b*).

The process rate switching signal which is supplied to the above-described respective blocks is generated by the process rate switching means 14. Here, for example, the process rate switching means 14 may be realized as one which has a jitter information detection means 43 for averaging absolute values of phase error information in a predetermined period, to detect a jitter amount as an index relating to a phase deviation which is generated when digital data is recorded on a recording medium, with the phase error information outputted from a phase error selection means 10 being an input signal; judges by a jitter judgement means 46 that jitter is large when the jitter information outputted from the jitter information detection means 43 is equal to or larger than a prescribed threshold value, and judges that jitter is small when the jitter information is equal to or smaller than the threshold value; and generates a process rate switching signal by a process rate judgement means 15 on the basis of jitter judgement information as the result of the judgement by the jitter judgement means 46.

For example, the process rate switching means 14 may be realized as one which selects a channel rate process data demodulation means 13*a* when it is judged that jitter is large, and selects a half rate process data demodulation means 13*b* when it is judged that jitter is small.

The partial response equalization signal outputted by a series of operations as described above passes through a half rate process maximum likelihood decoder 17 for performing decoding according to the type of partial response, whereby data demodulation is performed. Here, the half rate process maximum likelihood decoder 17 may be realized by, for example, a viterbi decoder for performing a demodulation process by employing the frequency half as high as the channel bit frequency, as described for the first embodiment.

Here, a channel rate process data demodulation means 13*a* may be realized so that the process rate switching means 14 generates a process rate switching signal to perform a data demodulation process by mainly employing the channel bit frequency, and in the phase locked loop means 13, the channel rate process offset detection means 18 in the process rate variable type offset correction means 4, and the channel rate process phase error detection means 8 are selected, and the process rate variable type transversal filter 5 operates on the basis of the channel bit frequency, and an output signal therefrom passes through the data interpolation means 7 and is subjected to digital data demodulation by the half rate process maximum likelihood decoder 17. Further, a half rate process data demodulation means 13*b* may be realized so that the process rate switching means 14 generates a process rate switching signal to perform a data demodulation process by employing the frequency half as high as the channel bit frequency, and in the phase locked loop means 13, the half rate process offset detection means 19 in the process rate variable type offset correction means 4, as well as the half rate process phase error detection means 9 are selected, and the process rate variable type transversal filter 5 operates on the basis of the frequency half as high as the channel bit frequency, and an output signal therefrom passes through the data interpolation means 7 and is subjected to digital data demodulation by the half rate process maximum likelihood decoder 17.

By a series of measures as described above, which make full use of the characteristics of the 8–16 modulation code or the like to switch a process rate for the PRML signal process by the process rate switching means 14 according to a jitter amount included in a reproduction signal, the quality of the demodulation data is maintained in a favorable state even when the quality of the reproduction signal is deteriorated due to large jitter.

Figure 21:
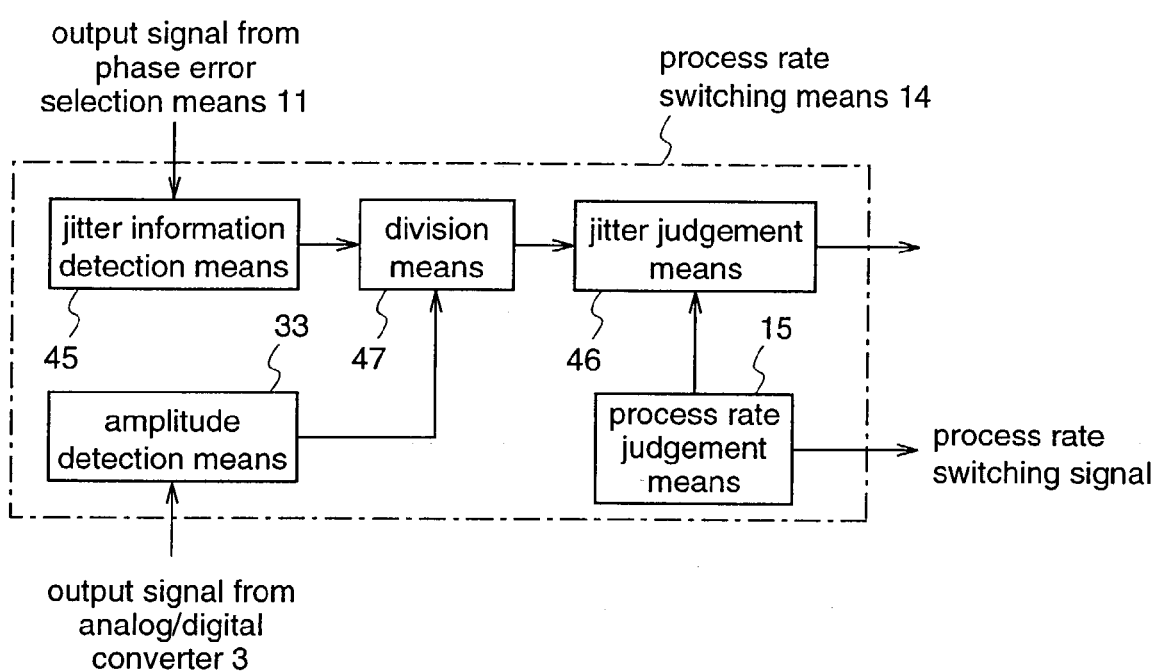
FIG. 21 is a block diagram illustrating the construction of a process rate switching means 14 according to the fourth embodiment.

Further, for example, the process rate switching means 14 as described for the fourth embodiment may be as shown in FIG. 21. Since the phase error information depends on an amplitude of a reproduction signal, it is possible that the phase error information is not detected accurately when the amplitude of the reproduction signal varies. Then, as shown in FIG. 21, the process rate switching means 14 has a jitter information detection means 45 for averaging absolute values of the phase error information in a prescribed period, with the phase error information outputted from the phase error selection means 10 being an input signal, and divides the output signal from the jitter information detection means 45 by amplitude information outputted from an amplitude detection means 33, by a division means 47 which receives the amplitude information outputted from the amplitude detection means 33 as an input signal, so as to take into account dependence of the jitter information upon an amplitude value in a reproduction waveform. Next, the jitter judgement means 46 judges that jitter is large when the jitter information outputted from the division means 47 is equal to or larger than a prescribed threshold value, judges that jitter is small when the jitter information is equal to or smaller than the threshold value, and the process rate judgement means 15 generates a process rate switching signal on the basis of jitter judgement information as the result of the judgement by the jitter judgement means 46.

By employing the process rate switching means 14 as described above, the jitter information can be judged accurately independently of the amplitude of a reproduction signal, whereby power consumption can be reduced while the quality of the demodulation data is maintained in a favorable state.

As described above, according to the fourth embodiment, a function of switching between a channel rate process and a half rate process by a sampling rate variable process is provided, and the channel rate process which puts priority on a reading performance is selected when the jitter judgement means judges that a jitter amount is large, while the half rate process which is advantageous in terms of power consumption is selected when the jitter judgement means judges that a jitter amount is small, whereby a stable reading operation is performed even when an S/N ratio is deteriorated, and power consumption is suppressed.

Embodiment 5

An optical disk reproducing device according to a fifth embodiment initially selects a process that employs a half rate as a data demodulation process rate in favor of reduced power consumption, and switches the half rate process to a channel rate processing at a retrial process when reading cannot be performed by the half rate process.

Hereinafter, the optical disk reproducing device according to the fifth embodiment will be described with reference to FIGS. 2 to 9($b$) and 22 to 26.

Figure 22:
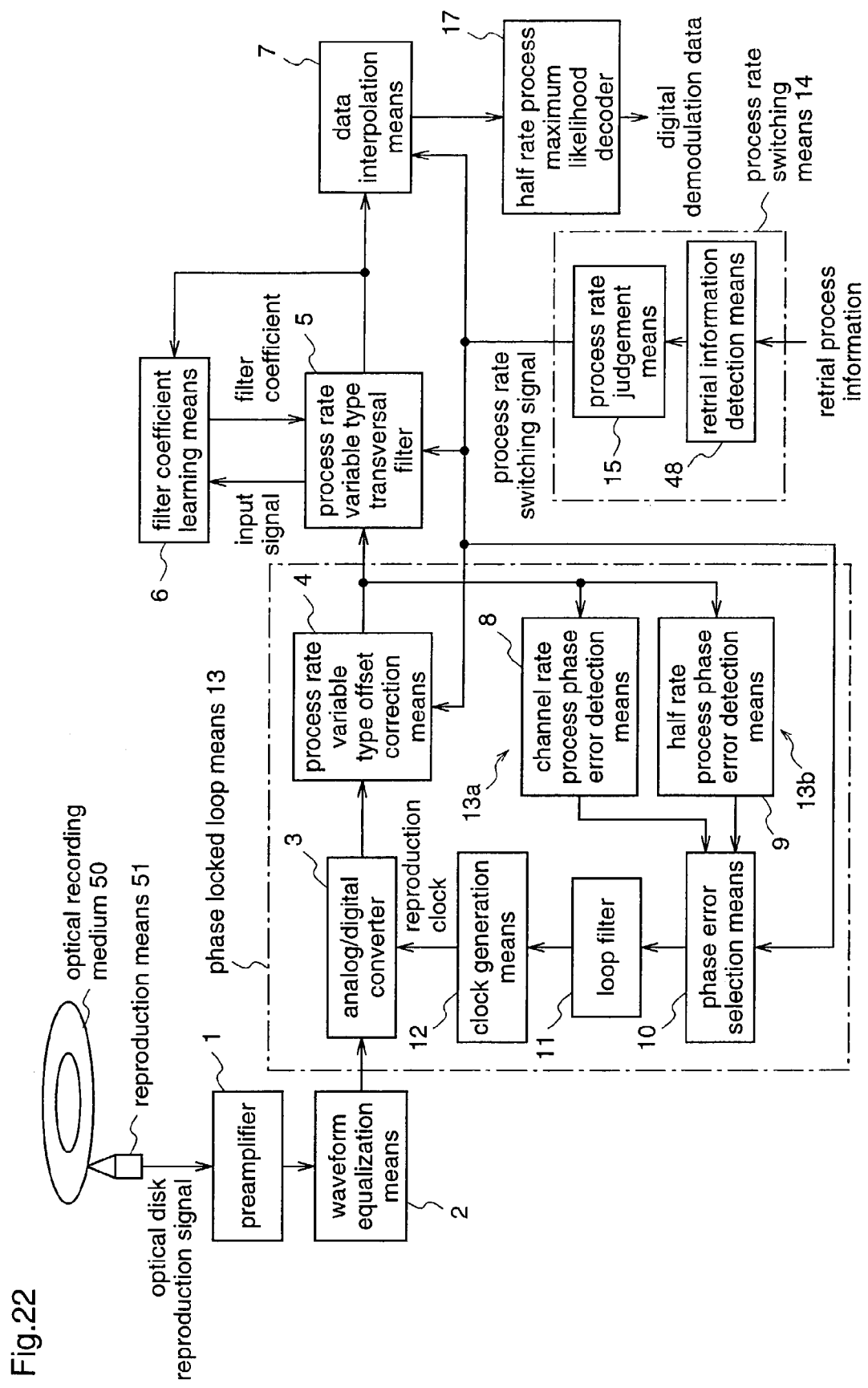
FIG. 22 is a block diagram illustrating the construction of a process rate variable type optical disk reproducing device according to a fifth embodiment of the present invention.

In FIG. 22, an output amplitude of an optical disk reproduction signal which is reproduced from an optical recording medium 50 by a reproduction means 51 is emphasized by a preamplifier 1, and thereafter the optical disk reproduction signal is corrected by a waveform equalization means 2 so that a high frequency band thereof is emphasized. The waveform equalization means 2 comprises a filter which enables a boost amount and a cutoff frequency to be set arbitrarily. This waveform equalization means 2 may be, for example, a high-order ripple filter or the like, which has frequency characteristics as shown as a solid line in FIG. 2.

Next, an output signal from the waveform equalization means 2 is sampled into a multi-bit digital signal by an analog/digital converter 3 which is a means for converting an analog signal into a digital signal. The analog/digital converter 3 performs sampling by employing a reproduction clock which is generated by a clock generation means 12. At this time, in cases where a code of digital data to be demodulated is one in which the minimum run-length is limited to "2", like, for example, an 8–16 modulation code employed for a DVD, and MTF characteristics as optical reproduction characteristics are distributed in a band which is almost a quarter or less of a channel bit frequency as shown in FIG. 3, digital data can be demodulated theoretically according to a sampling theorem, even when sampling is performed by the analog/digital converter 3 by employing a reproduction clock which has a frequency component half as high as the channel bit frequency.

By utilizing this, the present invention enables the selection between a case where a reproduction clock is generated on the basis of the channel bit frequency, and a case where a reproduction clock is generated on the basis of frequency which is half as high as the channel bit frequency. This sampled multi-bit digital signal is inputted to a process rate variable type offset correction means 4, thereby correcting an offset component included in the reproduction digital signal.

For example, the process rate variable type offset correction means 4 may be realized as one which has the construction as described for the first embodiment in FIG. 4.

Next, an output signal from the process rate variable type offset correction means 4 is inputted to a process rate variable type transversal filter 5 to be subjected to partial response equalization. Here, partial response equalization employs a PR (a, b, b, a) system in which, for example, a reproduction signal of a DVD has its waveform amplitude after equalization divided into five values as shown in FIG. 5($c$). Black circles "●" and white circles "○" in FIGS. 5($b$) and ($c$) indicate data sampled by a reproduction clock. When sampling is performed by employing a clock which is generated on the basis of the channel bit frequency, the signal comprises both sampled data "●" and "○". On the other hand, when sampling is performed by employing a clock which is generated on the basis of the frequency half as high as the channel bit frequency, the signal comprises either one sampled data "●" or "○".

Conventionally, in a lead channel employed for optical disk reproduction, a waveform-equalized output signal as shown in FIG. 5($a$) is subjected to binarization judgement with the center level thereof as a slice level, whereby digital data demodulation is performed. Further, sampling is performed at prescribed sections as shown in FIG. 5($b$), and a sampled multi-bit digital signal is subjected to binarization judgement with the center level thereof as a slice level.

On the other hand, according to the PR (a, b, b, a) system, a signal in which sampling data of four different times are added at a rate a:b:b:a (a+b*D+b*D2+a*D4) is generated, and characteristics corresponding to a low-pass filter as shown in FIG. 3 are added to a reproduction signal.

It is thought that a partial response system that has frequency characteristics nearer to the MTF characteristics shown in FIG. 3 is a more favorable system. In addition to the systems shown in FIG. 3 including the PR (a, b, b, a) system, there exist various types of partial response systems. It is not restricted to a filter of specific system, and filters of other types may be also employed as long as they achieve desired equalization performance. A partial response system which adds correlation in the direction of time of reproduction data, and a viterbi decoder, as one of after-mentioned maximum likelihood decoding methods, which estimates the most likely series by utilizing the added data correlation are used together, whereby the PRML signal process which is supposed to be advantageous in high-density recording/reproduction in the linear recording direction is realized.

As described above, since various PRML signal process systems exist according to characteristics of reproduction waveform or modulation code, an appropriate system should be selected for a recording/reproduction system of each kind. A process rate variable type transversal filter 5 may be, for example, an FIR filter which comprises finite taps. Equalization characteristics obtained by the FIR filter is achieved by varying a filter coefficient.

For example, the FIR filter may be realized as one as described for the first embodiment in FIG. 6.

The filter coefficients S1 to S7 of the FIR filter are set by a filter coefficient learning means 6 that utilizes an LMS algorithm for adaptively performing control so that an equalization error existing in a partial response equalization output signal outputted from the process rate variable type transversal filter 5 has a minimum value.

For example, the filter coefficient learning means 6 may have the construction as described for the first embodiment in FIG. 7.

The output signal from the FIR filter comprises both black circles "●" and white circles "○" in FIG. 5(*c*) when the signal is processed by employing the channel bit frequency, and comprises either black circles "●" or white circles "○" in FIG. 5(*c*) when the signal is processed by employing the frequency half as high as the channel bit frequency. Accordingly, with respect to an output signal which is subjected to partial response equalization by employing the frequency half as high as the channel bit frequency, intermediate data lacking at sampling is interpolated by a data interpolation means 7. The data interpolation means 7 may be realized by, for example, a filter having Nyquist characteristics that is described for the first embodiment in FIG. 8. In this case, filter coefficients as indicated by white circles "○" in FIG. 8 which are placed at intervals of twice as long cycle as a channel bit cycle are applied, whereby lacking data can be restored by Nyquist interpolation.

When a reproduction clock is generated by the process rate switching means 14 on the basis of the channel bit frequency, a phase error is detected from an output signal generated from the analog/digital converter 3 and the process rate variable type offset correction means 4, by the channel rate process phase error detection means 8. When a reproduction clock is generated by the process rate switching means 14 on the basis of the frequency half as high as the channel bit frequency, a phase error is detected by the half rate process phase error detection means 9.

Either one of phase error signals detected by the channel rate process phase error detection means 8 and the half rate process phase error detection means 9 is selected by the phase error selection means 10 according to a process rate switching signal, and thereafter the selected phase error signal is outputted to the clock generation means 12 through the loop filter 11 for smoothing the phase error signal, and the clock generation means 12 is controlled so that phase of the reproduction clock is synchronized with phase of a clock component of the reproduction signal, on the basis of the output signal from the loop filter 11.

There is provided a phase locked loop means 13 which performs sampling of a reproduction waveform with the analog/digital converter 3 by employing the reproduction clock generated through the path that starts at the analog/digital converter 3 and ends at the clock generation means 12, whereby a multi-bit sampling signal which is synchronized with the phase of the clock component of the reproduction signal is generated. In this way, the PRML signal process is realized.

The phase locked loop means 13 may be realized as one which makes the phase of the clock component of the reproduction data synchronized with the phase of the reproduction clock on the basis of a principle as described for the first embodiment in FIGS. 9(*a*) and 9(*b*).

The process rate switching signal which is supplied to the above-described respective blocks is generated by the process rate switching means 14. Here, for example, the process rate switching means 14 may be realized as one which has a retrial information detection means 48 for detecting retrial process information which is generated when a re-reading process is performed for a part where data demodulation has failed, and generates a process rate switching signal by a process rate judgement means 15 on the basis of the retrial information detected by the retrial information detection means 48. The process rate switching means 14 may be realized as one which generates a process rate switching signal so that a half rate process data demodulation means 13b is selected when the retrial information detection means 48 judges that there is no retrial process, and the half rate process data demodulation means 13b is switched to a channel rate process data demodulation means 13a when the retrial information detection means 48 judges that there occurs a retrial process.

The partial response equalization signal outputted by a series of operations as described above is inputted to a half rate process maximum likelihood decoder 17 for performing decoding according to the type of partial response, whereby data demodulation is performed. Here, the half rate process maximum likelihood decoder 17 may be realized by, for example, a viterbi decoder for performing a demodulation process by employing the frequency half as high as the channel bit frequency, as described for the first embodiment.

Here, a channel rate process data demodulation means 13a may be realized so that the process rate switching means 14 generates a process rate switching signal to perform a data demodulation process by mainly employing the channel bit frequency, and in the phase locked loop means 13, the channel rate process offset detection means 18 in the process rate variable type offset correction means 4, and the channel rate process phase error detection means 8 are selected, and the process rate variable type transversal filter 5 operates on the basis of the channel bit frequency, and an output signal therefrom passes through the data interpolation means 7 and is subjected to digital data demodulation by the half rate process maximum likelihood decoder 17.

Further, a half rate process data demodulation means 13*b* may be realized so that the process rate switching means 14 generates a process rate switching signal to perform a data demodulation process by employing the frequency half as high as the channel bit frequency, and in the phase locked loop means 13, the half rate process offset detection means 19 in the process rate variable type offset correction means 4, as well as the half rate process phase error detection means 9 are selected, and the process rate variable type transversal filter 5 operates on the basis of the frequency half as high as the channel bit frequency, and an output signal therefrom passes through the data interpolation means 7 and is subjected to digital data demodulation by the half rate process maximum likelihood decoder 17.

By a series of measures as described above, which make full use of the characteristics of the 8–16 modulation code or the like to switch a process rate for the PRML signal process by the process rate switching means 14 according to the presence or absence of retrial process, the quality of the demodulation data is maintained in a favorable state even when quality deterioration in a reproduction signal is so notable that a retrial process occurs.

Figure 23:
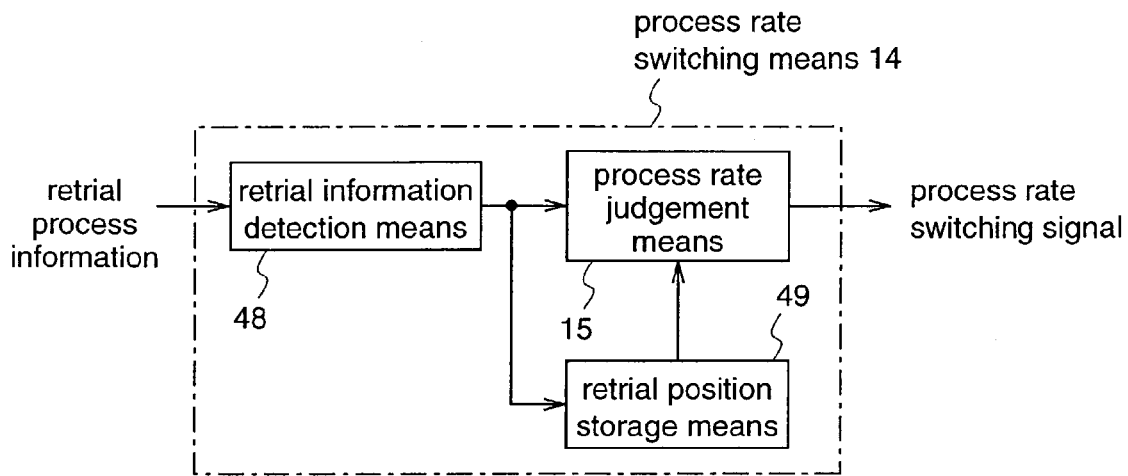
FIG. 23 is a block diagram illustrating the construction of a process rate switching means 14 according to the fifth embodiment.

Further, for example, the process rate switching means 14 as described for the fifth embodiment may be realized as shown in FIG. 23. For example, the process rate switching means 14 may be realized as one which has the retrial information detection means 48 for detecting retrial process information which is generated when a re-reading process is performed for a part where data demodulation has failed, generates a process rate switching signal by the process rate judgement means 15 on the basis of the retrial information detected by the retrial information detection means 48, and further has a retrial position storage means 49 for storing a position where a retrial process is detected by the retrial information detection means 48 occurs, and, when data demodulation is performed again for a position where reproduction has been performed once, refers to the retrial information stored in the retrial position storage means 49, to generate a process rate switching signal so that the channel rate process data demodulation means 13*a* is selected in advance for a part where a retrial process has been performed at least once.

By employing the process rate switching means 14 as described above, a data demodulation process rate can be switched in advance for a part where a retrial process has been performed at least once, whereby the accuracy of data demodulation at second or subsequent times is increased and a reading performance is stabilized.

Figure 24:
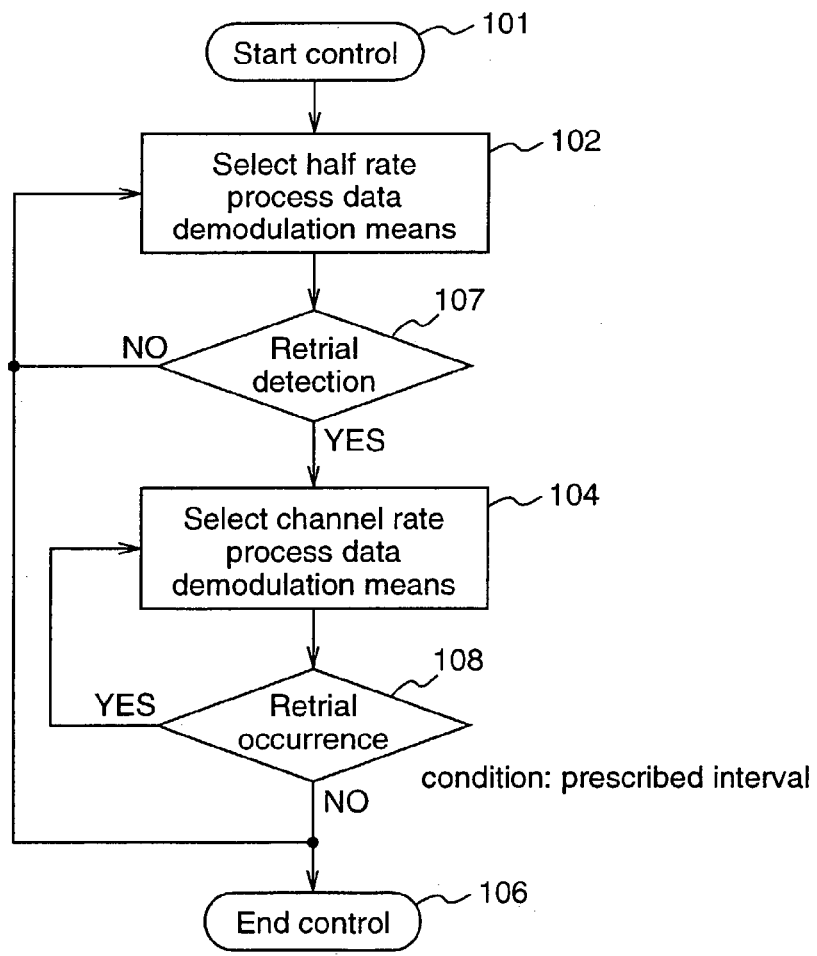
FIG. 24 is a flowchart illustrating a method for controlling a process rate switching means 14 according to the fifth embodiment.

Further, for example, the process rate switching means 14 as described for the fifth embodiment may be controlled according to the flow as shown in a flowchart in FIG. 24.

Initially, at control start (process 101), the half rate process data demodulation means 13*b* for performing a data demodulation process by employing the frequency half as high as the channel bit frequency is selected (process 102). Next, the retrial information detection means 48 judges the presence or absence of retrial process (process 107), and the half rate process data demodulation means 13*b* continues as it is when the retrial information detection means 48 judges that there is no retrial process, while the half rate process data demodulation means 13*b* is switched to the channel rata process data demodulation means 13*a* that mainly employs the channel bit frequency to perform a data demodulation process, when the retrial information detection means 48 judges that a retrial process occurs (process 104). Thereafter, the retrial information detection means 48 judges whether a retrial process occurs in a prescribed section or not (process 108), and a process rate switching signal is controlled so that the channel rate process data demodulation means 13*a* is continued when the retrial information detection means 48 judges that a retrial process occurs, and the half rate process data demodulation means 13*b* is resumed when the retrial information detection means 48 judges that no retrial process occurs (process 102), and this process is repeated until control end (process 106).

By employing the process rate switching means 14 as described above, a data demodulation process rate is not frequently changed, and thus it is possible to realize a stable system which gives priority over the quality of the demodulation data for a part where the data demodulation is difficult.

Figure 25:
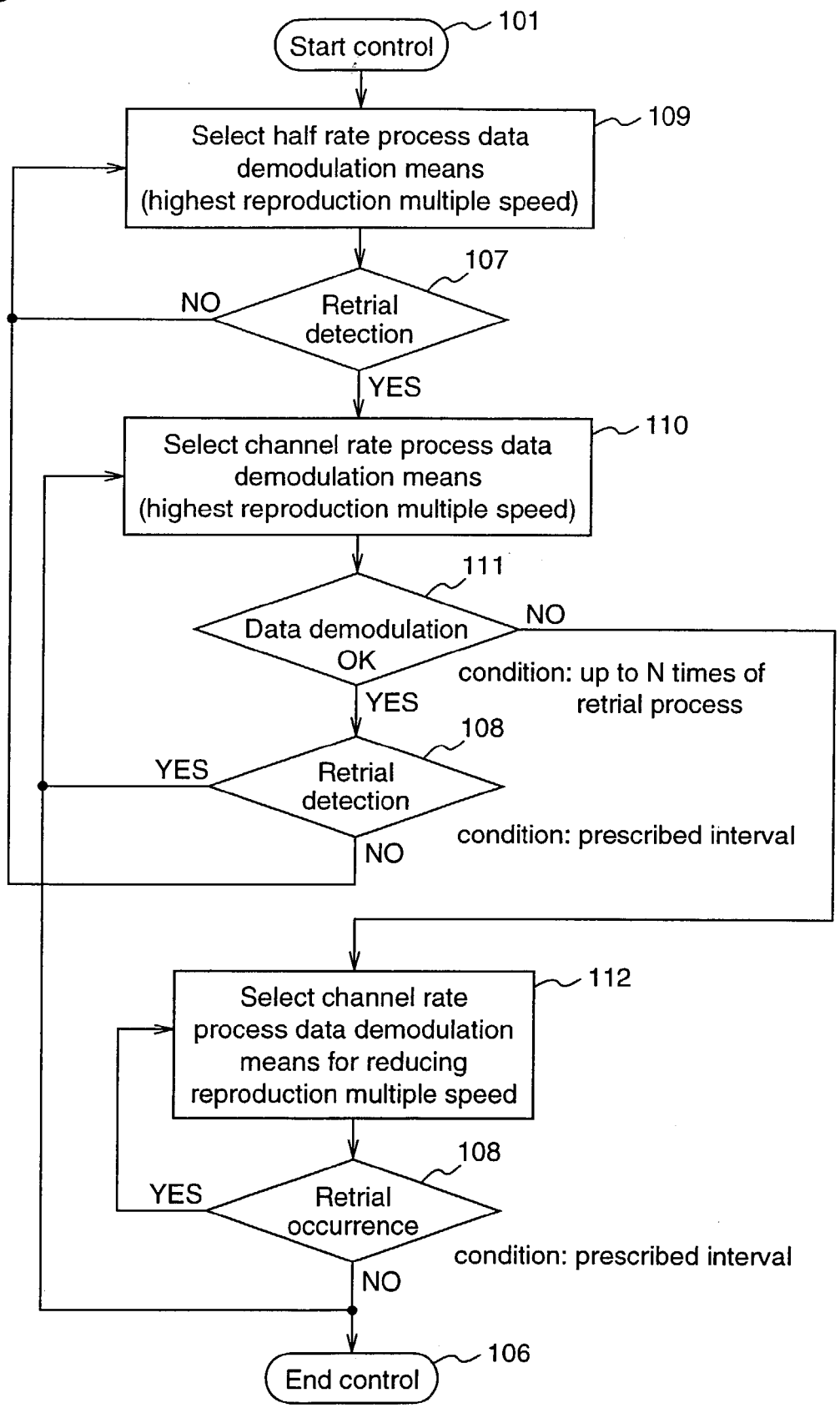
FIG. 25 is a flowchart illustrating a method for controlling a process rate switching means 14 according to the fifth embodiment.

Furthermore, for example, the process rate switching means 14 as described for the fifth embodiment may be controlled according to the flow as shown in a flowchart in FIG. 25.

Initially, at control start (process 101), the half rate process data demodulation means 13*b* for performing a data demodulation process by employing the frequency half as high as the channel bit frequency, and the highest reproduction multiple speed of the optical disk reproducing device are selected (process 109). Next, the retrial information detection means 48 judges the presence or absence of retrial process (process 107), and the half rate process data demodulation means 13*b* continues as it is when the retrial information detection means 48 judges that there is no retrial process, while the half rate process data demodulation means 13*b* is switched to the channel rata process data demodulation means 13*a* that mainly employs the channel bit frequency to perform a data demodulation process in a state where the highest reproduction multiple speed is maintained, when the retrial information detection means 48 judges that a retrial process occurs (process 110). Thereafter, a retrial process is repeated for prescribed number of times, N, ("N" is a positive integer) until data demodulation is performed (process 111), and when data demodulation is performed, the retrial information detection means 48 judges whether a retrial process occurs in a prescribed section or not (process 108), and the channel rate process data demodulation means 13*a* is continued when the retrial information detection means 48 judges that a retrial process occurs, while the half rate process data demodulation means 13*b* is resumed at the highest reproduction multiple speed when the retrial information detection means 48 judges that no retrial process occurs (process 109).

On the other hand, when data demodulation cannot be performed even after N times of repeated retrial process, a reproduction multiple speed is reduced by a reproduction multiple speed varying means (process 112). Thereafter, at a time when data demodulation is performed, the retrial information detection means 48 judges whether a retrial process occurs in a prescribed section or not (process 108), a process rate switching signal is controlled so that the channel rate process data demodulation means 13*a* is continued in a state where the reproduction multiple speed is reduced, when the retrial information detection means 48 judges that a retrial process occurs, and the reproduction multiple speed is returned to the highest reproduction multiple speed in a state where the channel rate process data demodulation means 13*a* is continued, when the retrial information detection means 48 judges that no retrial process occurs (process 110), and this process is repeated until control end (process 106). When data demodulation cannot be performed even after repeated retrial process, the reproduction multiple speed may be reduced to the lowest reproduction multiple speed of the optical disk reproducing device by the reproduction multiple speed varying means.

By employing the process rate switching means 14 as described above, the data demodulation process rate can be switched so as to give priority over the quality of the demodulation data for a part where the data demodulation is difficult, whereby the number of times of the retrial process is reduced, and a normal reproduction state can be restored quickly.

Figure 26:
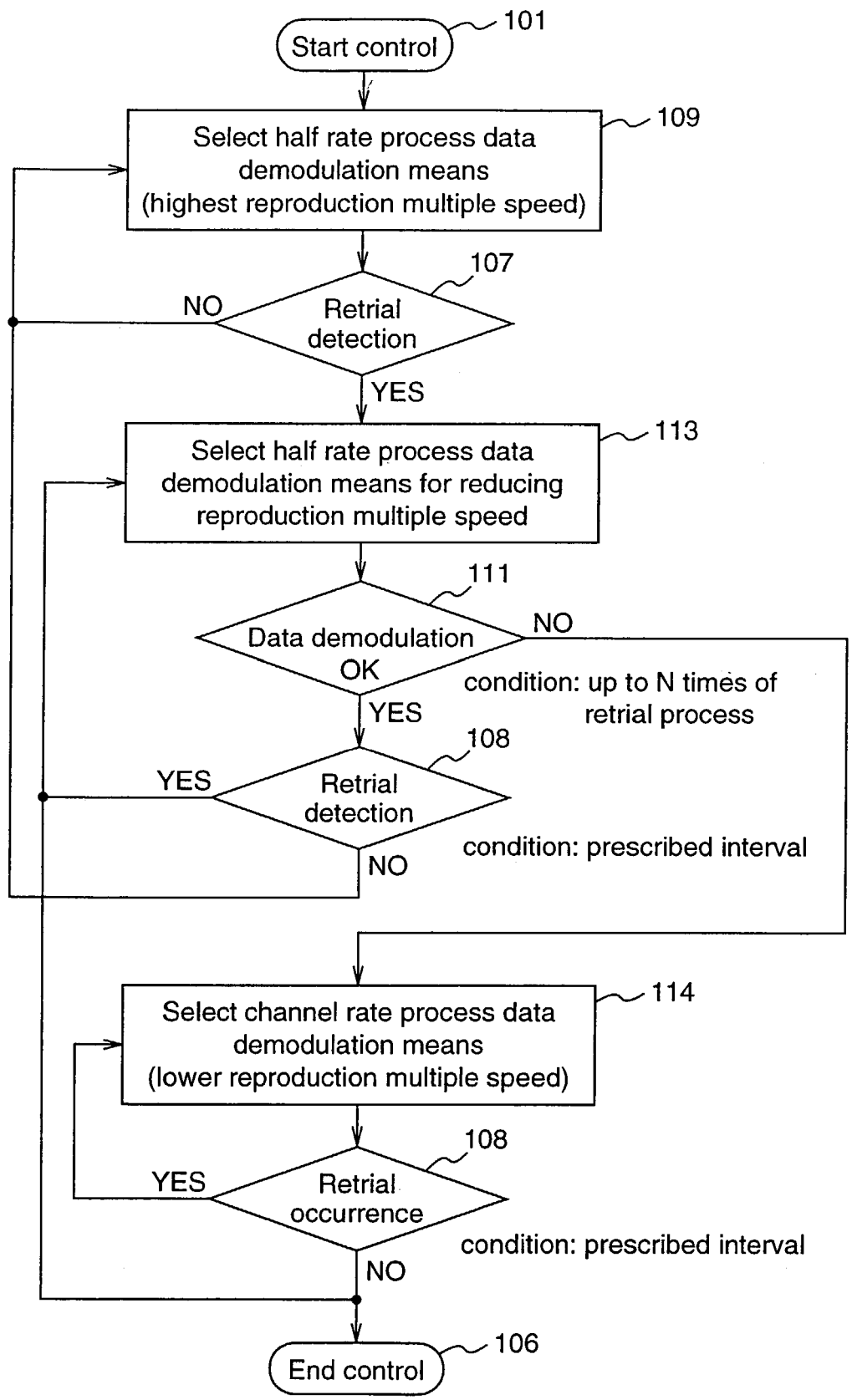
FIG. 26 is a flowchart illustrating a method for controlling a process rate switching means 14 according to the fifth embodiment.
Figure 27:
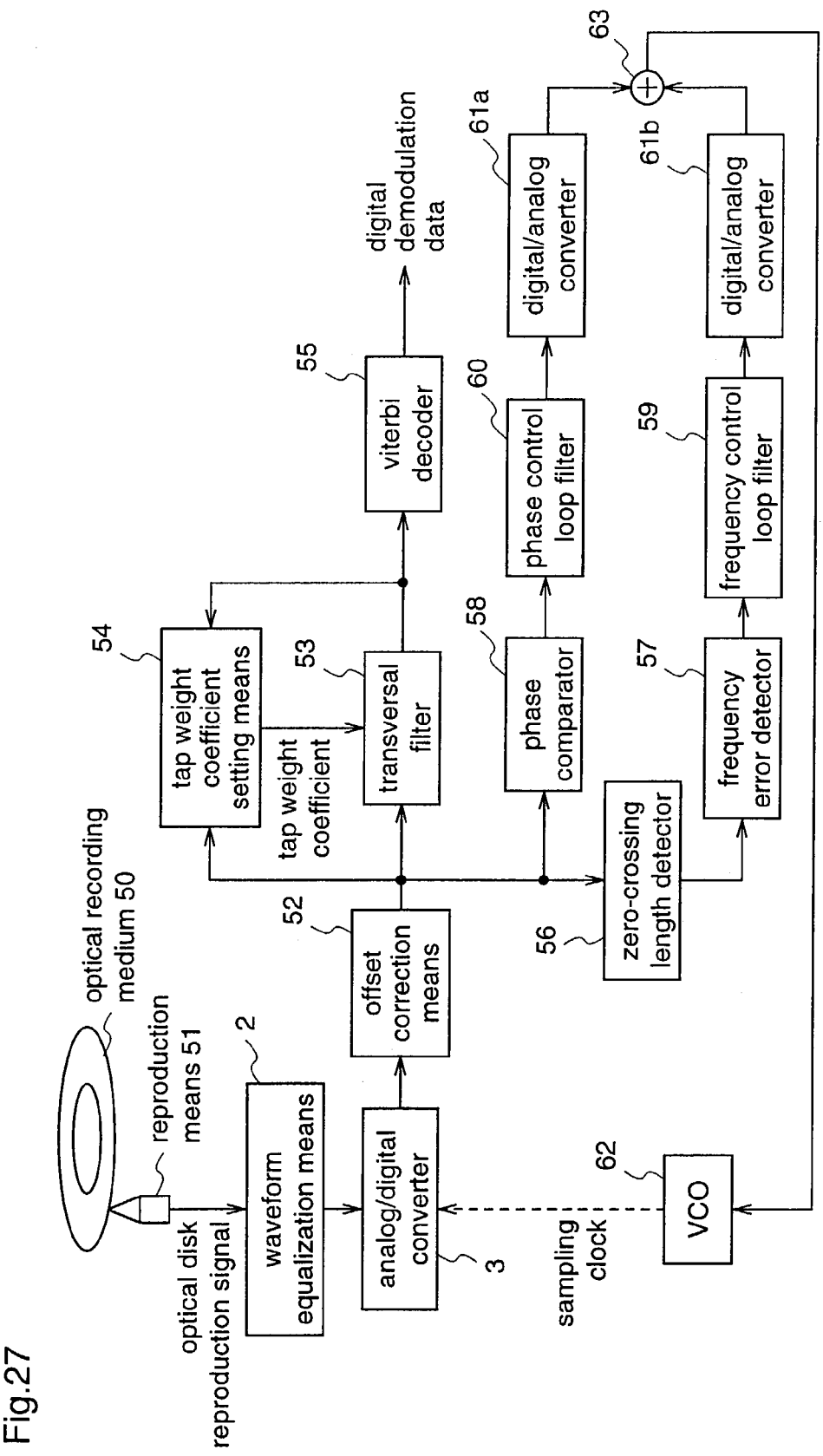
FIG. 27 is a block diagram illustrating the construction of a conventional optical disk reproducing device.

Moreover, for example, the process rate switching means 14 described for the fifth embodiment may be controlled according to the flow as shown in a flowchart in FIG. 26. Initially, at control start (process 101), the half rate process data demodulation means 13b for performing a data demodulation process by employing the frequency half as high as the channel bit frequency, and the highest reproduction multiple speed of the optical disk reproducing device are selected (process 109). Next, the retrial information detection means 48 judges the presence or absence of retrial process (process 107), and the half rate process data demodulation means 13b continues as it is when the retrial information detection means 48 judges that there is no retrial process, while a reproduction multiple speed is reduced by the reproduction multiple speed varying means in a state where the half rate process data demodulation means 13b is continued, when the retrial information detection means 48 judges that a retrial process occurs (process 113). Thereafter, a retrial process is repeated for prescribed number of times, N, ("N" is a positive integer) until data demodulation is performed (process 111), and when data demodulation is performed, the retrial information detection means 48 judges whether a retrial process occurs in a prescribed section or not (process 108), and the half rate process data demodulation means 13b is continued in a state where the reproduction multiple speed is reduced, when the retrial information detection means 48 judges that a retrial process occurs, while the reproduction multiple speed is returned to the highest reproduction multiple speed by the reproduction multiple speed varying means in a state where the half rate process data demodulation means 13b is continued, when the retrial information detection means 48 judges that no retrial process occurs (process 109). On the other hand, when data demodulation cannot be performed even after N times of repeated retrial process, the channel rate process data demodulation means 13a is selected in a state where the reproduction multiple speed is reduced (process 114). Thereafter, at a time when data demodulation is performed, the retrial information detection means 48 judged whether a retrial process occurs in a prescribed section or not (process 108), a process rate switching signal is controlled so that the channel rate process data demodulation means 13a continues in a state where the reproduction multiple speed is reduced, when the retrial information detection means 48 judges that a retrial process occurs, and the half rate process data demodulation means 13b is resumed in a state where the reproduction multiple speed is reduced, when the retrial information detection means 48 judges that no retrial process occurs (process 113), and this process is repeated until control end (process 106). When data demodulation cannot be performed even after repeated retrial process, the reproduction multiple speed may be reduced to the lowest reproduction multiple speed of the optical disk reproducing device by the reproduction multiple speed varying means.

By employing the process rate switching means 14 as described above, the data demodulation process rate can be switched so as to give priority over reduction of power consumption with respect to a part where data demodulation is difficult, whereby the power consumption for the entire retrial process can be reduced.

As described above, according to the fifth embodiment, a function of switching between a channel rate process and a half rate process by a sampling rate variable process is provided, and the half rate process which is advantageous in terms of power consumption is initially selected, and the half rate process is unconditionally switched to the channel rate process at retrial process when reading cannot be performed by the half rate process, thereby increasing the possibility that data which cannot be reproduced by the half rate process can be reproduced, resulting in an increase in a reading performance with suppressed power consumption.

While in the above-described first to fifth embodiments the descriptions have been given taking cases where the recording media are optical disks as examples, the embodiments are applicable to a reproducing device or a recording/reproducing device which employs other recording media such as a magnetic recording medium, whereby the same effect as achieved by the respective embodiments can be obtained.

APPLICABILITY IN INDUSTRY

As described above, an optical disk reproducing device according to the present invention is suited to be employed for a part where phase synchronization is performed after waveform equalization of an optical disk reproduction signal in a reproduction system for reproducing digital data which is recorded on an optical disk, so as to reduce power consumption while maintaining a quality of reproduced digital data and a reading performance.

The invention claimed is:

1. An optical disk reproducing device comprising:
a channel rate process data demodulation part operable to demodulate digital data from an optical recording medium on which the data is digitally recorded in a form of recording codes having a restriction that at least three consecutive data have a same value, by employing a channel bit frequency;
a half rate process data demodulation part operable to demodulate the digital data from the optical recording medium by employing a frequency that is half of the channel bit frequency; and
a process rate switching part operable to switch between the channel rate process data demodulation part and the half rate process data demodulation part, thereby switching a process rate of data demodulation, wherein
the process rate switching part is operable to generate a process rate switching signal so that, when data demodulation is performed with rotation of the optical recording medium kept constant, the channel rate process data demodulation part is selected for an inner circumference side where a channel frequency is low, and the half rate process data demodulation part is selected for an outer circumference side where a channel frequency is high.

2. The optical disk reproducing device as defined in claim 1, wherein
the process rate switching part is operable to judge that a reproduction position is at the inner or outer circumference side of the optical recording medium based on address information recorded on the optical recording medium, and generate the process rate switching signal according to the judged reproduction position.

3. An optical disk reproducing device comprising:
a data demodulation part operable to demodulate digital data from an optical recording medium on which the data is digitally recorded in a form of recording codes having a restriction that at least three consecutive data have a same value, by selectively employing a channel bit frequency or a frequency that is half of the channel bit frequency; and
a process rate switching part operable to control the data demodulation part to switch between the channel bit frequency or the frequency that is half of the channel bit frequency for demodulating the digital data, wherein
the process rate switching part is operable to generate a process rate switching signal so that, when data demodulation is performed with rotation of the optical recording medium kept constant, the channel bit frequency is selected for an inner circumference side where a channel frequency is low, and the frequency that is half of the channel bit frequency is selected for an outer circumference side where a channel frequency is high.

4. The optical disk reproducing device as defined in claim 3, wherein
the process rate switching part is operable to judge that a reproduction position is at the inner or outer circumference side of the optical recording medium based on address information recorded on the optical recording medium, and generate the process rate switching signal according to the judged reproduction position.

* * * * *